US008372196B2

(12) United States Patent
Nakamura et al.

(10) Patent No.: US 8,372,196 B2
(45) Date of Patent: Feb. 12, 2013

(54) SUSCEPTOR DEVICE, MANUFACTURING APPARATUS OF EPITAXIAL WAFER, AND MANUFACTURING METHOD OF EPITAXIAL WAFER

(75) Inventors: Motonori Nakamura, Omura (JP); Yoshinobu Mori, Omura (JP); Takeshi Masuda, Omura (JP); Hidenori Kobayashi, Omura (JP); Kazuhiro Narahara, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 753 days.

(21) Appl. No.: 12/610,708

(22) Filed: Nov. 2, 2009

(65) Prior Publication Data

US 2010/0112213 A1    May 6, 2010

(30) Foreign Application Priority Data

Nov. 4, 2008  (JP) ................. 2008-283182
Nov. 4, 2008  (JP) ................. 2008-283183

(51) Int. Cl.
*C30B 21/02* (2006.01)
(52) U.S. Cl. .............. 117/86; 117/90; 117/92; 117/104; 118/715; 118/718; 118/719
(58) Field of Classification Search .............. 117/86, 117/104, 90, 92; 118/715, 718, 719
See application file for complete search history.

(56) References Cited

U.S. PATENT DOCUMENTS

| | | |
|---|---|---|
| 2009/0127672 A1 | 5/2009 | Kinbara |
| 2009/0205562 A1 | 8/2009 | Wada |
| 2009/0235867 A1 | 9/2009 | Fujikawa et al. |
| 2009/0304975 A1 | 12/2009 | Sugimoto et al. |
| 2009/0321874 A1 | 12/2009 | Aoki et al. |

FOREIGN PATENT DOCUMENTS

| | | |
|---|---|---|
| JP | 8-064544 | 3/1996 |
| JP | 10-335435 | 12/1998 |
| JP | 2000-269137 | 9/2000 |
| JP | 2003-007694 | 1/2003 |
| JP | 2003-197546 | 7/2003 |
| JP | 2007-088303 | 4/2007 |

OTHER PUBLICATIONS

English language Abstract of JP 2000-269137, Sep. 29, 2000.
English language Abstract of JP 2003-197546, Jul. 11, 2003.
Japan (JP Appl. No. 2008-283182) Office action, dated Oct. 16, 2012 along with an English translation thereof.
Japan (JP Appl. No. 2008-283183) Office action, dated Oct. 16, 2012 along with an English translation thereof.

*Primary Examiner* — Bob M Kunemund
(74) *Attorney, Agent, or Firm* — Greenblum & Bernstein, P.L.C.

(57) ABSTRACT

In a manufacturing apparatus for manufacturing an epitaxial wafer with a wafer being mounted substantially concentrically with a susceptor, a center rod is provided to extend in an up-and-down direction on a side of a non-mounting surface of the susceptor so that its upper end is adjacent to the center of the susceptor. With this arrangement, part of radiation light irradiated toward the susceptor is diffusely reflected by the center rod before reaching the central portion of the susceptor, thereby reducing the amount of the radiation light irradiated to the central portion of the susceptor as well as lowering the temperature of the portion. Since the center rod and the susceptor are not in surface contact, the center rod does not take the heat from the susceptor, thereby suppressing the temperature from decreasing locally at the central portion of the susceptor.

13 Claims, 17 Drawing Sheets

SUSCEPTOR DEVICE, MANUFACTURING APPARATUS OF EPITAXIAL WAFER, AND MANUFACTURING METHOD OF EPITAXIAL WAFER

The entire disclosure of Japanese Patent Applications No. 2008-283182 filed Nov. 4, 2008, and No. 2008-283183 filed Nov. 4, 2008, are expressly incorporated by reference herein.

BACKGROUND OF THE INVENTION

1. Field of the Invention

The present invention relates to a susceptor device, manufacturing apparatus of epitaxial wafers and a method of manufacturing epitaxial wafers.

2. Description of Related Art

Methods of manufacturing epitaxial wafers have been known to include growing epitaxial films in vapor phase onto surface of the wafers (see e.g., Document 1: JP-A-2000-269137).

Document 1 discloses that a back surface of a susceptor is supported by a quartz support shaft at three points. Above and below the susceptor supported by the support shaft, heaters for heating the susceptor and wafer with radiation heat are provided, and such heaters include halogen lamps and the like.

However, in the structure disclosed in Document 1 in which a non-mounting surface of the susceptor is only peripherally supported by the support shaft, radiation light from the heaters reaches the susceptor from the front, back, left and right and concentrates on the central portion of the non-mounting surface of the susceptor. Accordingly, the portion of the susceptor corresponding to the center of the epitaxial wafer ("center" means a single center point) and its neighborhood (hereinafter referred to as "susceptor-center-corresponding portion") exhibits higher temperature than the surrounding portion. Consequently, the epitaxial film at the central portion of the epitaxial wafer becomes much thicker than at the surrounding portion. In other words, nonuniformity in the thickness is increased at the central portion of the epitaxial wafer ("central portion" means a portion corresponding to substantially a circle described around the center of the epitaxial wafer with the diameter of approximately A/2 where the diameter of the epitaxial wafer is set at A). The "nonuniformity in the thickness at the central portion of the epitaxial wafer" is hereinafter referred to as "central thickness nonuniformity."

One possible method to reduce such central thickness nonuniformity is to greatly reduce the amount of reaction gas used in vapor-phase growth of the epitaxial film.

However, the reduction in the amount of the reaction gas can improve the central thickness nonuniformity, but invites abnormal growth on the back surface of the epitaxial wafer, so that nanotopography is deteriorated.

SUMMARY OF THE INVENTION

An object of the invention is to provide a susceptor device, manufacturing apparatus of epitaxial wafers and method of manufacturing epitaxial wafers that are capable of reducing nonuniformity in thickness of epitaxial films without inviting abnormal growth on the back surfaces of the epitaxial wafers.

A susceptor device according to an aspect of the invention is for use to hold a material wafer in a manufacturing apparatus of an epitaxial wafer, the manufacturing apparatus irradiating radiation light toward the material wafer from a back surface side opposite to a film-forming surface of the material wafer to heat the material wafer, the manufacturing apparatus manufacturing the epitaxial wafer by growing an epitaxial film in vapor phase on the film-forming surface while the material wafer is heated, the susceptor device including: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape and extending in a direction substantially orthogonal to a non-mounting surface on a side of the non-mounting surface opposite to the mounting surface, an end of the temperature controller being adjacent to a portion of the non-mounting surface without contacting, the portion of the non-mounting surface corresponding to the center of the material wafer.

According to the aspect of the invention, the temperature controller shaped substantially in a rod and provided on the side of the non-mounting surface of the susceptor blocks the irradiated radiation light. Thus, as compared to a structure where no temperature controller is provided, the temperature of the susceptor-center-corresponding portion can be decreased.

When the non-mounting surface of the susceptor and the end of the temperature controller are in surface contact with each other, the temperature controller absorbs the heat from the susceptor at its surface contact portion, and the susceptor exhibits a lower temperature locally at that portion than at the other portion. Resultantly, the epitaxial film may become thinner locally at its central portion than at the neighboring portion.

In contrast, according to the aspect of the invention, since the end of the temperature controller is adjacent to the susceptor-center-corresponding portion of the non-mounting surface without contacting, the absorption of the heat from the susceptor-center-corresponding portion due to contacting can be prevented, thereby suppressing the temperature from being locally decreased.

Accordingly, the temperature of the susceptor-center-corresponding portion can be properly decreased. Thus, without greatly reducing the amount of the reaction gas, the vapor-phase grown epitaxial film can exhibit reduction in central thickness nonuniformity. Further, since there is no need to reduce the amount of the reaction gas for restraining the central thickness nonuniformity, the generation of abnormal growth on the back surface of the epitaxial wafer can be prevented.

When the wafer mounted on the susceptor is concentric with the susceptor, the susceptor-center-corresponding portion is a portion defined around the center of the susceptor. In this instance, the temperature controller is located adjacent to the center of the non-mounting surface at its end. On the other hand, when the wafer mounted on the susceptor is not concentric with the susceptor, the susceptor-center-corresponding portion is a portion defined around a point spaced from the center of the susceptor. In this instance, the temperature controller is located adjacent to the point spaced from the center of the non-mounting surface at its end.

Preferably in the susceptor device according to the aspect of the invention, a distance between the end of the temperature controller and the non-mounting surface is set to be 4 mm to 20 mm.

When the distance between the end of the temperature controller and the non-mounting surface of the susceptor (hereinafter referred to as temperature control spaced distance) is less than 4 mm, the two members are so excessively adjacent to each other that the heat of the susceptor may be greatly absorbed by the temperature controller. Accordingly, in comparison with a configuration where the distance is more than 4 mm, the configuration where the distance is less than 4 mm is more likely to invite a local temperature decrease, so that the epitaxial film may become thinner locally at its central portion than at the neighboring portion. On the other hand, when the temperature control spaced distance is more than 20 mm, the temperature controller may not be able to effectively block the radiation light irradiated to the non-mounting surface. Therefore, as in a configuration where no temperature controller is provided, the temperature of the susceptor-center-corresponding portion would become higher than that of the neighboring portion in the configuration where the distance is more than 20 mm. Accordingly, the central thickness nonuniformity may not be reduced while preventing the generation of abnormal growth on the back surface of the epitaxial wafer.

In contrast, according to the aspect of the invention, since the temperature control spaced distance is set to be 4 mm to 20 mm, the central thickness nonuniformity can be reduced without inviting the above-described deficiencies.

Preferably in the susceptor device according to the aspect of the invention, the temperature controller is treated so that its front surface reflects the radiation light.

Also preferably in the susceptor device according to the aspect of the invention, the temperature controller is made of a non-transparent material.

A temperature controller made of a transparent material such as quartz would be able to block the radiation light more than a configuration where no transparent controller is provided, when such a temperature controller is provided with some function for directly transmitting the radiation light without specularly reflecting or diffusely reflecting the radiation light. However, such a temperature controller would block the radiation light less than a temperature controller preliminarily provided with a function for reflecting the radiation light or than a temperature controller made of a non-transparent material. Accordingly, by providing the temperature controller with a function for reflecting the radiation light, the radiation light can be sufficiently blocked, and the central thickness nonuniformity can be reduced.

Preferably in the susceptor device according to the aspect of the invention, the temperature controller is detachably attached to the periphery support.

According to the aspect of the invention, since the temperature controller is detachably attached to the periphery support, the temperature controller can be easily replaced before being so much etched by hydrochloric gas as to greatly change its length and width. Thus, the epitaxial wafer of stable quality can be manufactured.

Preferably in the susceptor device according to the aspect of the invention, the temperature controller has a diameter of 3.0 mm to 22.0 mm.

The temperature controller having a diameter of 3.0 mm is capable of reducing the central thickness nonuniformity in epitaxial wafers having diameters of 200 mm, which are typically manufactured in large quantity. The temperature controller having a diameter of 22.0 mm is capable of reducing the central thickness nonuniformity in epitaxial wafers having diameters of 300 mm, which are typically manufactured in large quantity.

A manufacturing apparatus of an epitaxial wafer according to another aspect of the invention is an apparatus that manufactures the epitaxial wafer by growing an epitaxial film in vapor phase on a film-forming surface of a material wafer, the manufacturing apparatus including: the above-described susceptor device for holding the material wafer; a reaction container in which the susceptor device is placed, the reaction container capable of internally supplying reaction gas for growing the epitaxial film in vapor phase on the film-forming surface of the material wafer; and a back emitting heater that irradiates radiation light toward the material wafer from a back surface side opposite to the film-forming surface of the material wafer and heats the material wafer.

A method of manufacturing an epitaxial wafer according to a still further aspect of the invention includes: mounting a material wafer on a susceptor device for holding the material wafer; irradiating radiation light toward the material wafer from a back surface side opposite to a film-forming surface of the material wafer to heat the material wafer; supplying reaction gas to the material wafer while the material wafer is heated; and growing an epitaxial film in vapor phase on the film-forming surface, the susceptor device including: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape and extending in a direction substantially orthogonal to a non-mounting surface on a side of the non-mounting surface opposite to the mounting surface, an end of the temperature controller being adjacent to a portion of the non-mounting surface without contacting, the portion of the non-mounting surface corresponding to the center of the material wafer, the temperature controller controlling the temperature of the portion of the susceptor corresponding to the center of the material wafer by blocking the radiation light.

A susceptor device according to a still further aspect of the invention is for use to hold a material wafer in a manufacturing apparatus of an epitaxial wafer, the manufacturing apparatus irradiating radiation light toward the material wafer to heat the material wafer, the manufacturing apparatus manufacturing the epitaxial wafer by growing an epitaxial film in vapor phase on a film-forming surface of the material wafer while the material wafer is heated, the susceptor device including: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape or a substantially plate shape and extending in a direction substantially orthogonal to a non-mounting surface on a side of the non-mounting surface opposite to the mounting surface, an end of the temperature controller being substantially in point contact or line contact with a portion of the non-mounting surface, the portion of the non-mounting surface corresponding to the center of the material wafer.

The "substantially in point contact or line contact" means that the area at which the temperature controller and the susceptor are in contact with each other is extremely smaller than the area of the wafer. The contact area is suitably determined in accordance with the material and thickness of the susceptor. For instance, the contact area is preferably 0.05% or less of the area of the wafer.

When the non-mounting surface of the susceptor and the end of the temperature controller are in surface contact with each other, the temperature controller absorbs the heat from the susceptor at its surface contact portion, and the susceptor exhibits a lower temperature locally at that portion than at the other portion. Resultantly, the epitaxial film may become thinner locally at its central portion than at the neighboring portion.

In contrast, according to the aspect of the invention, since the end of the temperature controller is substantially in point contact or line contact with the susceptor-center-corresponding portion of the non-mounting surface, the absorption of the heat from the susceptor-center-corresponding portion due to the contacting can be reduced as compared to a configuration where the two members are in surface contact. Thus, without locally decreasing the temperature, the temperature of the susceptor-center-corresponding portion can be properly decreased.

Accordingly, the temperature of the susceptor-center-corresponding portion can be properly decreased. Thus, without greatly reducing the amount of the reaction gas, the vapor-phase grown epitaxial film can exhibit reduction in central thickness nonuniformity. Further, since there is no need to reduce the amount of the reaction gas for reduction in the central thickness nonuniformity, the generation of abnormal growth on the back surface of the epitaxial wafer can be prevented.

When the wafer mounted on the susceptor is concentric with the susceptor, the susceptor-center-corresponding portion is a portion defined around the center of the susceptor. In this instance, the temperature controller is substantially in point contact or line contact with the center of the non-mounting surface at its end. On the other hand, when the wafer mounted on the susceptor is not concentric with the susceptor, the susceptor-center-corresponding portion is a portion defined around a point spaced from the center of the susceptor. In this instance, the temperature controller is substantially in point contact or line contact with the point spaced from the center of the non-mounting surface at its end.

Preferably in the susceptor device according to the aspect of the invention, the end of the temperature controller is conical, pyramidal or semispherical and substantially in point contact with the non-mounting surface.

According to the aspect of the invention, by shaping the end of the temperature controller to be conical, pyramidal or semispherical, the temperature controller and the non-mounting surface can be brought substantially into point contact with each other without any detailed positioning adjustment.

Preferably in the susceptor device according to the aspect of the invention, the temperature controller is detachably attached to the periphery support.

According to the aspect of the invention, since the temperature controller is detachably attached to the periphery support, the temperature controller can be easily replaced before being so much etched by hydrochloric gas as to greatly change its length and width (i.e., contact area). Accordingly, by replacing the temperature controller as needed, the heat absorption can be kept substantially constant, and epitaxial wafers of stable quality can be manufactured.

A manufacturing apparatus of an epitaxial wafer according to a still further aspect of the invention is an apparatus that manufactures the epitaxial wafer by growing an epitaxial film in vapor phase on a film-forming surface of a material wafer, the manufacturing apparatus including: the above-described susceptor device for holding the material wafer; a reaction container in which the susceptor device is placed, the reaction container capable of internally supplying reaction gas for growing the epitaxial film in vapor phase on the film-forming surface of the material wafer; and an emitting heater that irradiates radiation light toward the material wafer and heats the material wafer.

The emitting heater may be an emitting heater that irradiates the radiation light from at least one of the film-forming side of the wafer and the back side opposite to the film-forming side.

A method of manufacturing an epitaxial wafer according to a still further aspect of the invention includes: mounting a material wafer on a susceptor device for holding the material wafer; irradiating radiation light toward the material wafer to heat the material wafer; supplying reaction gas to the material wafer while the material wafer is heated; and growing an epitaxial film in vapor phase on a film-forming surface of the material wafer, the susceptor device comprising: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape or a substantially plate shape and extending in a direction substantially orthogonal to a non-mounting surface on a side of the non-mounting surface opposite to the mounting surface, an end of the temperature controller being substantially in point contact or line contact with a portion of the non-mounting surface, the portion of the non-mounting surface corresponding to the center of the material wafer, the temperature controller controlling the temperature of the portion of the susceptor corresponding to the center of the material wafer by absorbing heat of the portion of the non-mounting surface corresponding to the center of the material wafer.

According to aspect of the invention, by providing the same susceptor as described above in the manufacturing apparatus, it is possible to provide manufacturing apparatus of epitaxial wafers and method of manufacturing epitaxial wafers that are capable of reducing the central thickness nonuniformity without inviting abnormal growth on the back surface of the epitaxial wafer.

DETAILED DESCRIPTION OF PREFERRED EMBODIMENT(S)

[First Exemplary Embodiment]

The first exemplary embodiment of the invention will be described below with reference to the attached drawings.
[Structure of Manufacturing Apparatus of Epitaxial Wafer]

First of all, structure of manufacturing apparatus of epitaxial wafers will be described.

Figure 1:
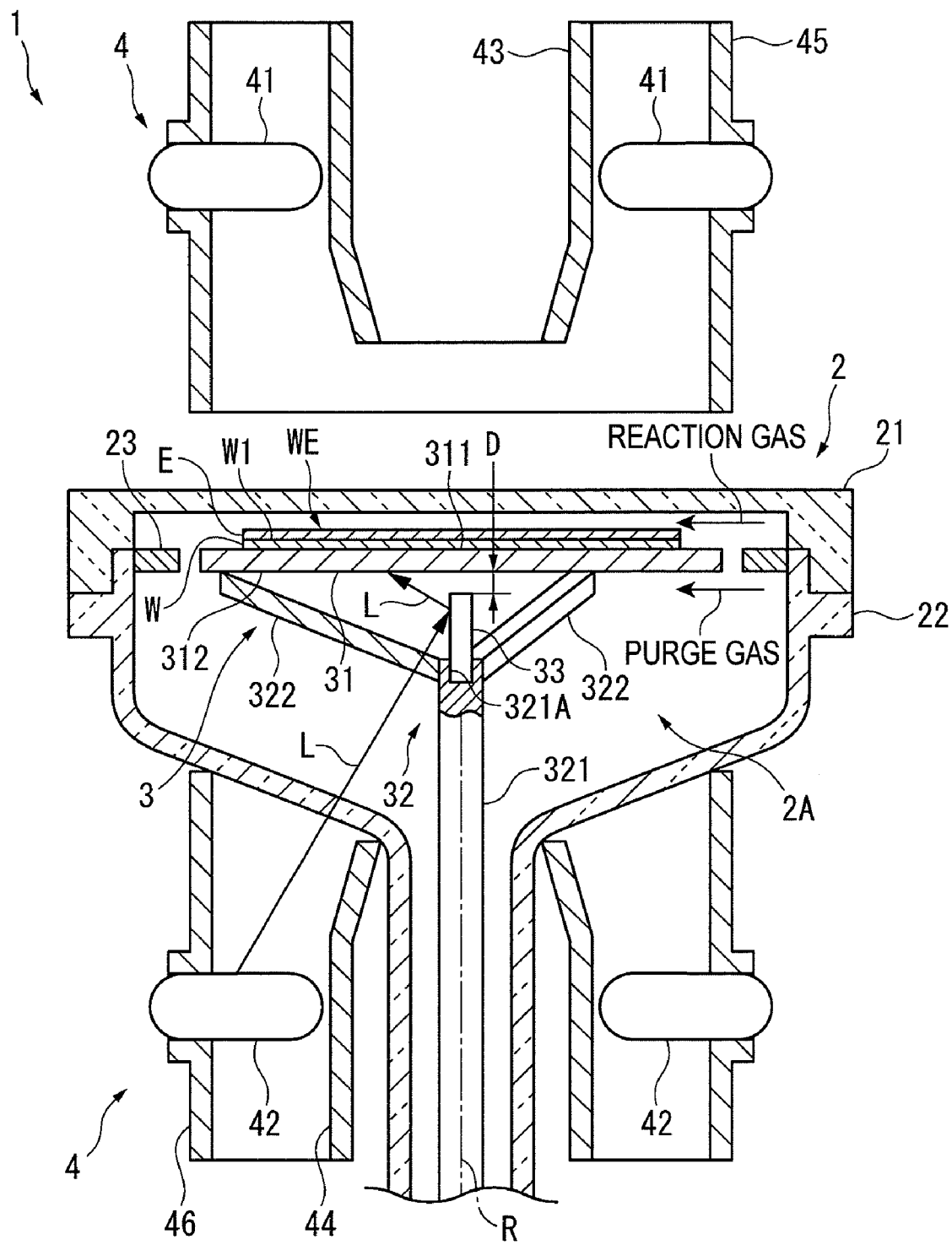
FIG. 1 is a cross sectional view showing a primary portion of a manufacturing apparatus of epitaxial wafers according to a first exemplary embodiment of the invention.
Figure 2:
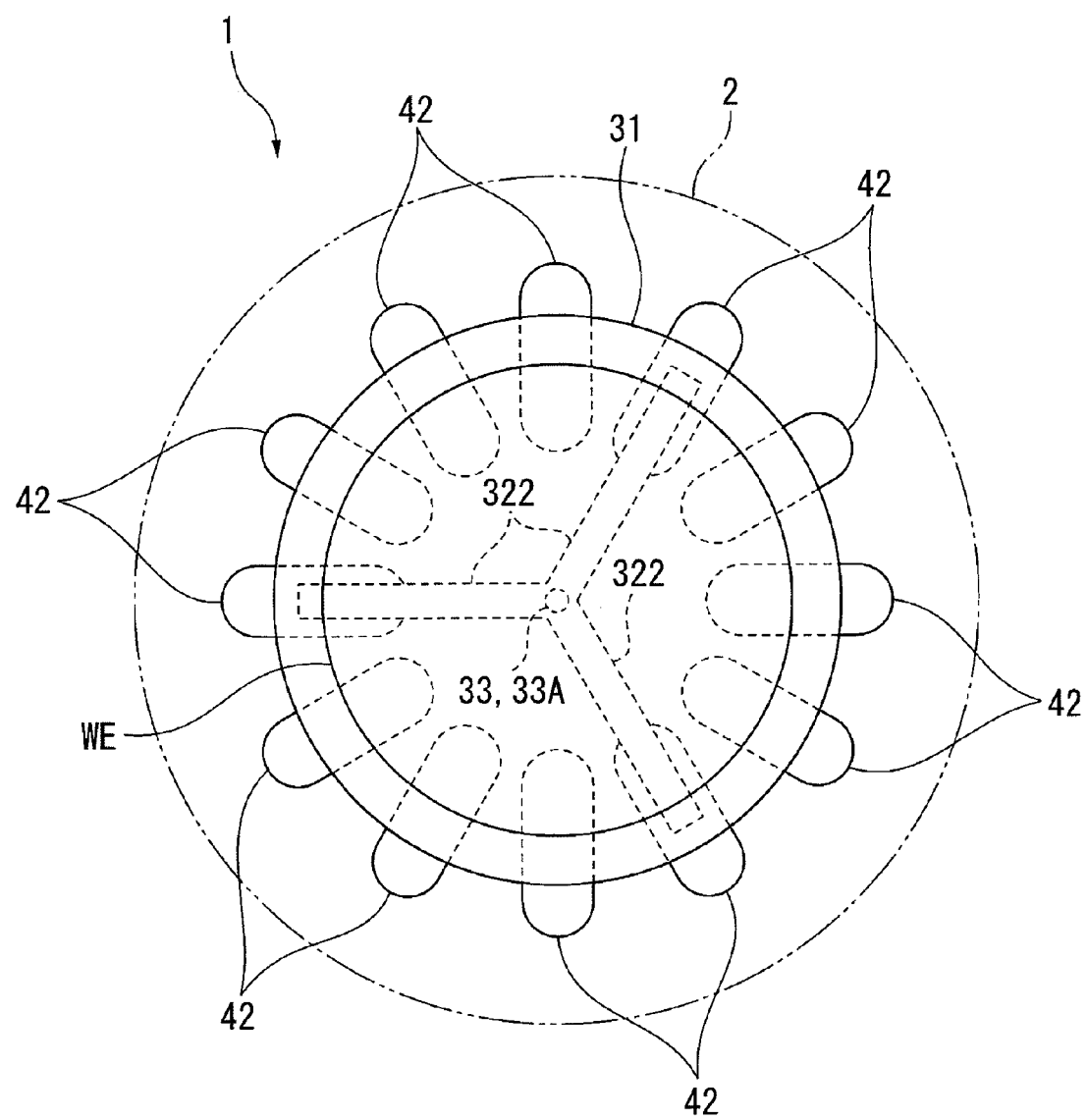
FIG. 2 is a plan view showing the manufacturing apparatus of epitaxial wafers according to the first and a second exemplary embodiment of the invention.

FIG. 1 is a cross sectional view showing a primary portion of the manufacturing apparatus of epitaxial wafers according to this exemplary embodiment. FIG. 2 is a plan view showing the manufacturing apparatus of epitaxial wafers.

As shown in FIG. 1, the manufacturing apparatus 1 of epitaxial wafers grows in vapor phase an epitaxial film E on a film-forming surface W1 of a wafer W obtained by slicing semiconductor crystal, to manufacture an epitaxial wafer WE. The manufacturing apparatus 1 includes a reaction container 2, susceptor device 3 and a heater 4 as shown in FIGS. 1 and 2.

The reaction container 2, in which the susceptor device 3 is placed, is capable of supplying reaction gas and purge gas into the inside. By supplying the reaction gas to the wafer W placed on the susceptor device 3, the epitaxial film E is grown in vapor phase on the film-forming surface W1 of the wafer W. The reaction container 2 includes an upper chamber member 21 and a lower chamber member 22.

The upper chamber member 21 and the lower chamber member 22, of which details are not illustrated, are formed by a combination of a plurality of light-transmissive materials (e.g., quartz) and centrally hollowed to define substantially recessed shapes in plane view. The upper chamber member 21 and the lower chamber member 22 are detachably fixed together so that the recessed shapes of the upper chamber member 21 and lower chamber member 22 are respectively open downwardly and upwardly. With this structure, a reaction chamber 2A is defined in the reaction container 2.

The inner circumference of the lower chamber member 22 is attached with a preheating ring 23 at its upper side. The inner diameter of the preheating ring 23 is set larger than the outer diameter of the later-described susceptor 31.

The lateral face of the reaction container 2 is provided with a reaction-gas feed pipe and reaction-gas outlet pipe (neither is shown) for substantially horizontally circulating the reaction gas on the film-forming surface 1 of the wafer W. The lateral face of the reaction container 2 is also provided with a purge-gas feed pipe and purge-gas outlet pipe (neither is shown) for circulating the purge gas below the susceptor 31 in substantially the same direction as the reaction gas.

Examples of the reaction gas are material gas for growing the epitaxial film E in vapor phase and mixture of such material gas and carrier gas. The material gas may be any gas suitable for growing the epitaxial film E in vapor phase, examples of which are mixture reaction gas obtained by attenuating $SiHCl_3$ (silicon source) and $B_2H_6$ (boron dopant source) with hydrogen gas. Examples of the carrier gas are gas containing hydrogen (carrier hydrogen).

The purge gas may be any one of various gas, an example of which is hydrogen gas (slit hydrogen).

The susceptor device 3, which holds the wafer W having a diameter of 200 mm or 300 mm in use, is placed in the reaction container 2. The susceptor device 3 includes the susceptor 31, a periphery support 32 and a center rod 33 (temperature controller).

The susceptor 31 is shaped substantially in a disk in plan view. The first surface of the susceptor 31 defines a mounting surface 311 on which the wafer W is mounted. The mounting surface 311 centrally has a recess (not shown) that is circular in plan view and conformed to the contour of the wafer W, so as to receive the wafer W in such a manner that the centers of the susceptor 31 and wafer W are substantially aligned.

The periphery support 32, which is made of a light-transmissive material such as quartz, protrudes into the reaction chamber 2A at the center of the lower chamber member 22 in the reaction container 2, and holds the susceptor 31 horizontally in the reaction container 2 for the wafer W to be mounted on the susceptor 31. The periphery support 32 is rotatable around the rotation axis R. The periphery support 32 includes: a support body 321 protruding into the reaction chamber 2A at the center of the lower chamber member 22; and three support rods 322 diagonally and upwardly extending from the upper end of the support body 321.

The periphery support rods 322 are provided approximately every 120 degrees in plan view. The three periphery support rods 322 distally support the periphery adjacent portion of the non-mounting surface 312 of the susceptor 31 at three points, whereby the susceptor 31 is provided horizontally in the reaction chamber 2A.

Incidentally, three or more periphery support rods 322 may be provided. Alternatively, a substantially conical cylinder member radially widened from the upper end of the support body 321 may be used instead of the periphery support rods 322.

A surface of the support body 321 near its upper end is provided with a rod-fitting recess 321A to which a lower end of the center rod 33 is detachably fitted. The center rod 33, which is made of a transparent material (e.g., quartz) and shaped substantially in cylinder, is fitted into the rod-fitting recess 321A at its lower end to extend in a direction substantially orthogonal to the non-mounting surface 312 (i.e., up-and-down direction) on the side of the non-mounting surface 312 of the susceptor 31. The center rod 33, of which surface is roughened by sandblasting, diffusely reflects the radiation light irradiated by the heater 4 to heat the wafer W. The length of the center rod 33 is set so that a temperature-control spaced distance D between the upper end of the center rod 33 and the non-mounting surface 312 is in a range of 4 mm to 20 mm. In other words, the center rod is positioned closer to the non-mounting surface 312 without contacting the center of the non-mounting surface 312 with its upper end. Further, the center rod 33 exhibits a diameter of 3.0 mm to 22.0 mm except for the portion fitted into the rod-fitting recess 321A. The diameter of the center rod 33 is exemplarily set at 4.7 mm when the diameter of the wafer W is 200 mm, or at 20.5 mm when the diameter of the wafer W is 300 mm.

The heater 4 includes: a plurality of front emitting heaters 41 provided above the reaction container 2; and a plurality of back emitting heaters 42 provided below the reaction container 2. The back emitting heaters 42 are positioned annularly and substantially concentrically with the susceptor 31, so as to irradiate the radiation light to the reaction container 2 from below and to heat the water W and the susceptor 31. Like the back emitting heaters 42, the front emitting heaters 41 are positioned annularly and substantially concentrically with the susceptor 31, so as to irradiate the radiation light to the reaction container 2 from above and to heat the water W and the susceptor 31.

The front and back emitting heaters 41 and 42 may be halogen lamps or infrared lamps.

The heater 4 further includes a front inner reflector 43, a back inner reflector 44, a front outer reflector 45 and a back outer reflector 46, all of which are substantially cylindrical. The front inner reflector 43 and the back inner reflector 44 respectively protrude toward the susceptor 31 in substantially annular inner spaces defined by the front emitting heaters 41 and the back emitting heaters 42. The front outer reflector 45 and the back outer reflector 46 respectively surround the protruding portions of the front inner reflector 43 and back inner reflector 44. The radiation light irradiated by the front emitting heaters 41 passes through between the front inner reflector 43 and the front outer reflector 45 and experiences reflection by these reflectors to reach the wafer W. The radiation light irradiated by the back emitting heaters 42 passes through between the back inner reflector 44 and the back outer reflector 46 and experiences reflection by these reflectors to reach the non-mounting surface 312 of the susceptor 31.

[Manufacturing Method of Epitaxial Wafer]

Next, a method of manufacturing the epitaxial wafer WE with use of the above-described manufacturing apparatus 1 will be described.

Initially, the front and back emitting heaters 41 and 42 are actuated to heat the susceptor 31 mounted with the wafer W up to a desirable growth temperature.

Then, while the periphery support 32 is rotated about the rotation axis R, the epitaxial film E is grown in vapor phase on the film-forming surface W1 of the wafer W in the below-described manner.

Specifically, immediately before the vapor-phase growth, the film-forming surface W1 of the wafer W is applied with caustic gas such as hydrochloric gas for gas-phase etching to remove a natural oxidation film on the film-forming surface W1. Then, the reaction gas is constantly supplied horizontally over the film-forming surface W1 of the wafer W, and the purge gas is introduced below the susceptor 31 at a predetermined timing.

By controlling the flow rates of the reaction gas and the purge gas, a reaction gas flow for circulating the reaction gas over the wafer W and a purge gas flow for circulating the purge gas below the susceptor 31 are generated at the time of growing the epitaxial film E in vapor phase. By conducting the vapor-phase growth in this manner, the epitaxial film E is formed on the front surface of the wafer W, and the epitaxial wafer WE is obtained.

On the other hand, the back emitting heaters 42 are substantially annularly positioned. Thus, when no center rod 33 is provided, the susceptor 31 is irradiated with the radiation light from the back emitting heaters 42 in a larger amount at its central portion than at its periphery, so that the susceptor 31 exhibits a higher temperature at its central portion than at its periphery.

However, in the manufacturing apparatus 1 provided with the center rod 33, a part of the radiation light L (see FIG. 1) directed to the central portion of the susceptor 31 is diffusely reflected (i.e., blocked) by the center rod 33 before reaching the central portion of the susceptor 31. Accordingly, in comparison with an apparatus provided with no center rod 33, the central portion of the susceptor 31 is irradiated with a less amount of the radiation light, and therefore the temperature at the central portion is lowered. Furthermore, since the center rod 33 and the susceptor 31 are not in a surface contact, the center rod 33 does not take the heat from the susceptor 31, thereby suppressing a local temperature decrease at the central portion of the susceptor 31.

Hence, as compared with a configuration provided with no center rod 33, the susceptor 31 can be heated while the temperature at the central portion is properly controlled. Therefore, without greatly reducing the amount of the reaction gas, the vapor-phase grown epitaxial film E can exhibit reduction in central thickness nonuniformity.

[Advantages of First Exemplary Embodiment]

The above-described exemplary embodiments can provide the following advantages.

(1) In the manufacturing apparatus 1, the substantially-cylindrical center rod 33 extends in the up-and-down direction on the side of the non-mounting surface 312 of the susceptor 31 to be close to the central portion of the susceptor 31 (susceptor-center-corresponding portion) without contacting at its upper end.

Accordingly, as described above, the central thickness nonuniformity can be reduced without reducing the amount of the reaction gas, and abnormal growth on the back surface of the epitaxial wafer WE can be prevented.

(2) Since the temperature-control spaced distance D is set in the range of 4 mm and 20 mm, the susceptor 31 and the center rod 33 are not in excessively close positions, and thus the heat of the susceptor 31 is not locally absorbed by the center rod 33 in a great quantity. In addition, the radiation light L can effectively block the radiation light L, thereby reducing the central thickness nonuniformity.

(3) Since the surface of the center rod 33 is subjected to sandblasting, the center rod 33 can sufficiently block the light as compared with a transparent center rod without sandblasting. Thus, the epitaxial wafers WE can be manufactured with the central thickness nonuniformity being reduced.

(4) Since the center rod 33 is detachably attached to the support body 321 of the periphery support 32, the center rod 33 can be easily replaced before being so much etched by hydrochloric gas as to greatly change its length and width. Thus, the epitaxial wafer WE of stable quality can be manufactured.

(5) Since the diameter of the center rod 33 is set in the range of 3.0 mm to 22.0 mm except for the portion fitted into the rod-fitting recess 321A, it is possible to reduce the central thickness nonuniformity in the epitaxial wafers WE having diameters of 200 mm and 300 mm.

(Examples of First Exemplary Embodiment)

Next, the advantages of the above-described embodiment will be described with reference to Examples.

{Relationship Between Presence of Center Rod and Abnormal Growth on Back Surface Under Film-Forming Condition for Reducing Central Thickness Nonuniformity in Three-Point Support Structure Provided with No Center Rod}

With use of the same apparatus as the manufacturing apparatus 1 of the above exemplary embodiment, a sample of Example 1 and a sample of Comparative 1 were manufactured by processing wafers having a diameter of 200 mm under the conditions shown in Table 1 below.

Except for the conditions listed in Table 1, Example 1 and Comparative 1 were manufactured under the same conditions (i.e., flow rate of reaction gas, concentration of reaction gas, growth time, flow rate of slit hydrogen and total flow rate were the same). In addition, SLM (standard liter per minute), a unit of flow rate, is a value obtained by converting the flow rate under 0 degrees C. and 1 atmosphere into liter/min. In addition, the total flow rate means the total flow rate of process gas used in the manufacturing process of the epitaxial films and obtained by summing the flow rate of carrier hydrogen and the flow rate of reaction gas together. The employed center rod was cylindrical and its front surface was sandblasted.

TABLE 1

|  | Example 1 (rod-adjacent structure) | Comparative 1 (three-point support structure) |
|---|---|---|
| Center Rod | Provided | Not Provided |
| Center Rod Diameter (mm) | 4.7 | — |
| Temperature-Control Spaced Distance D (mm) | 6.7 | — |
| Flow Rate of Carrier Hydrogen (SLM) | 32.5 | 32.5 |
| Abnormal Growth on Back Surface | Present | Present |

The samples according to Example 1 and Comparative 1 were measured radially at a plurality of positions to obtain thicknesses of the epitaxial films, and a thickness index was obtained from the obtained thicknesses. Specifically, the thickness index was obtained by dividing the thicknesses of the epitaxial films at the plurality of positions by an overall average thickness of the epitaxial films of the samples (which is denoted as thickness of epitaxial film/ave[a.u.] in FIG. 3). The results are shown in the graph of FIG. 3.

The flow rate of the carrier hydrogen (the flow rate of the reaction gas) shown in Table 1 was set such that the central thickness nonuniformity (i.e., nonuniformity of thicknesses at positions located within a range of approximately ±50 mm from the center, which substantially covers a circle having half the diameter of the diameter (200 mm) of the epitaxial wafer) in the sample according to Comparative 1 adopting a three-point structure would be reduced.

Figure 3:
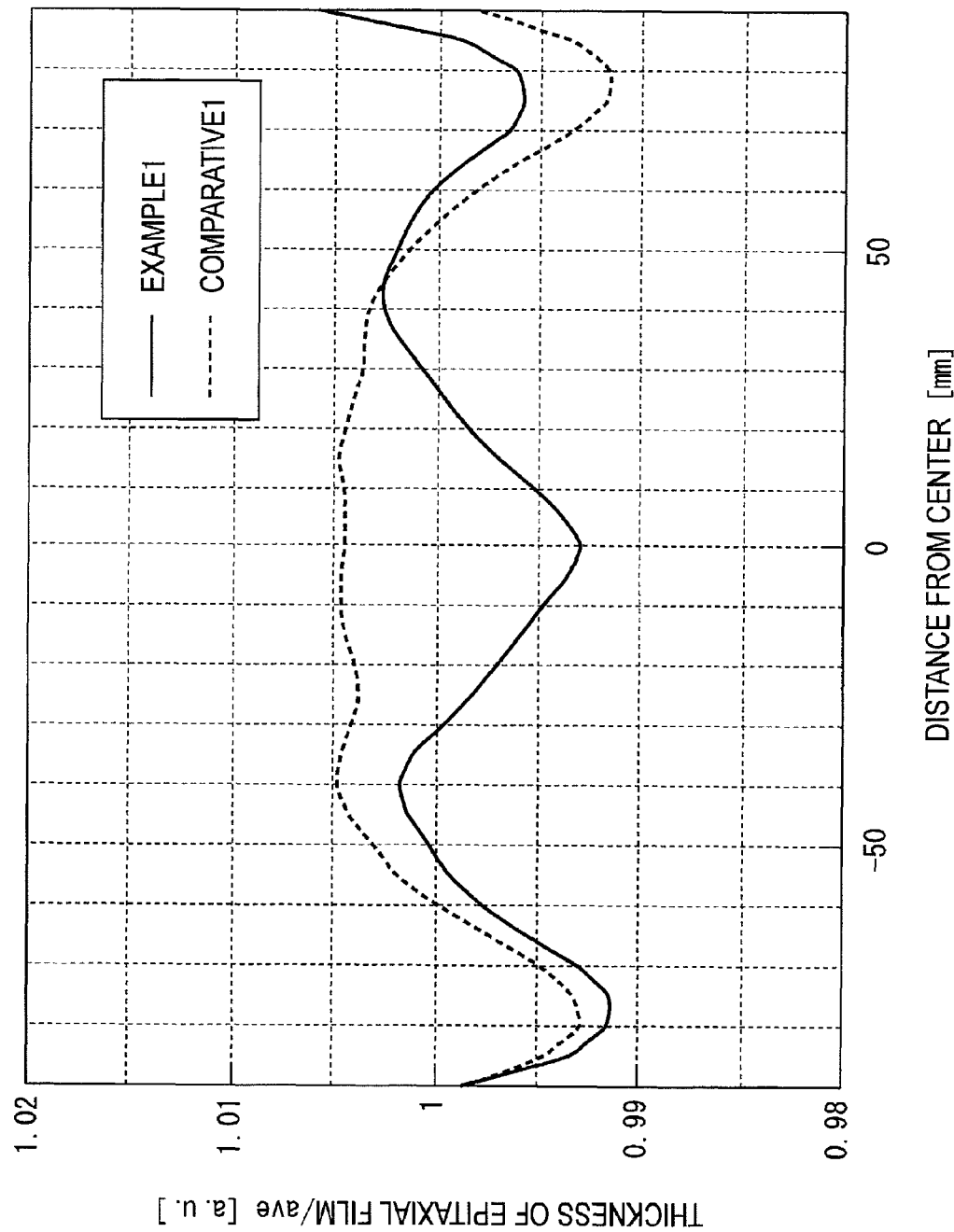
FIG. 3 is a graph showing a relationship between the presence of a center rod and central thickness nonuniformity under a film-forming condition for reducing the central thickness nonuniformity in a three-point support structure according to an example of the first exemplary embodiment.

As shown in FIG. 3, the central thickness nonuniformity in the sample according to Example 1 was increased under the flow rate of the carrier hydrogen set for reducing the central thickness nonuniformity of Comparative 1.

In addition, generation of abnormal growth was found on the back surfaces of the samples of Comparative 1 and Example 1.

Accordingly, it has been found difficult to realize both of: prevention of the abnormal growth on the back surface; and reduction in the central thickness nonuniformity, in the three-point support structure.

On the other hand, in the structure where the center rod was provided adjacent to the susceptor without contacting (rod-adjacent structure), the central thickness of the epitaxial film became considerably smaller than the thickness of the neighborhood, even though the flow rate of the carrier hydrogen was so set as to be capable of reducing the central thickness nonuniformity in the three-point support structure. Thus, the central thickness nonuniformity was increased. Presumably, the center rod blocked the radiation light irradiated to the susceptor-center-corresponding portion to lower the temperature at the susceptor-center-corresponding portion, which is considered to have resulted in reduction in the central thickness of the epitaxial film.

{Relationship Between Flow Rate of Carrier Hydrogen and Central Thickness Uniformity in Rod-Adjacent Structure}

With use of the same apparatus as in Example 1, samples of Examples 2 to 5 were manufactured by processing wafers having a diameter of 200 mm under the conditions shown in Table 2 below. The conditions other than those shown in Table 2 were set to be the same conditions as applied to the sample of Example 1.

Then, a thickness index was obtained from the thicknesses of the epitaxial film exhibited at a plurality of positions. The results are shown in the graph of FIG. 4.

TABLE 2

|  | Example 2 (Rod-adjacent structure) | Example 3 (Rod-adjacent structure) | Example 4 (Rod-adjacent structure) | Example 5 (Rod-adjacent structure) |
|---|---|---|---|---|
| Flow Rate of Carrier Hydrogen (SLM) | 30 | 40 | 50 | 60 |
| Abnormal Growth on Back Surface | Present | None | None | None |

Figure 4:
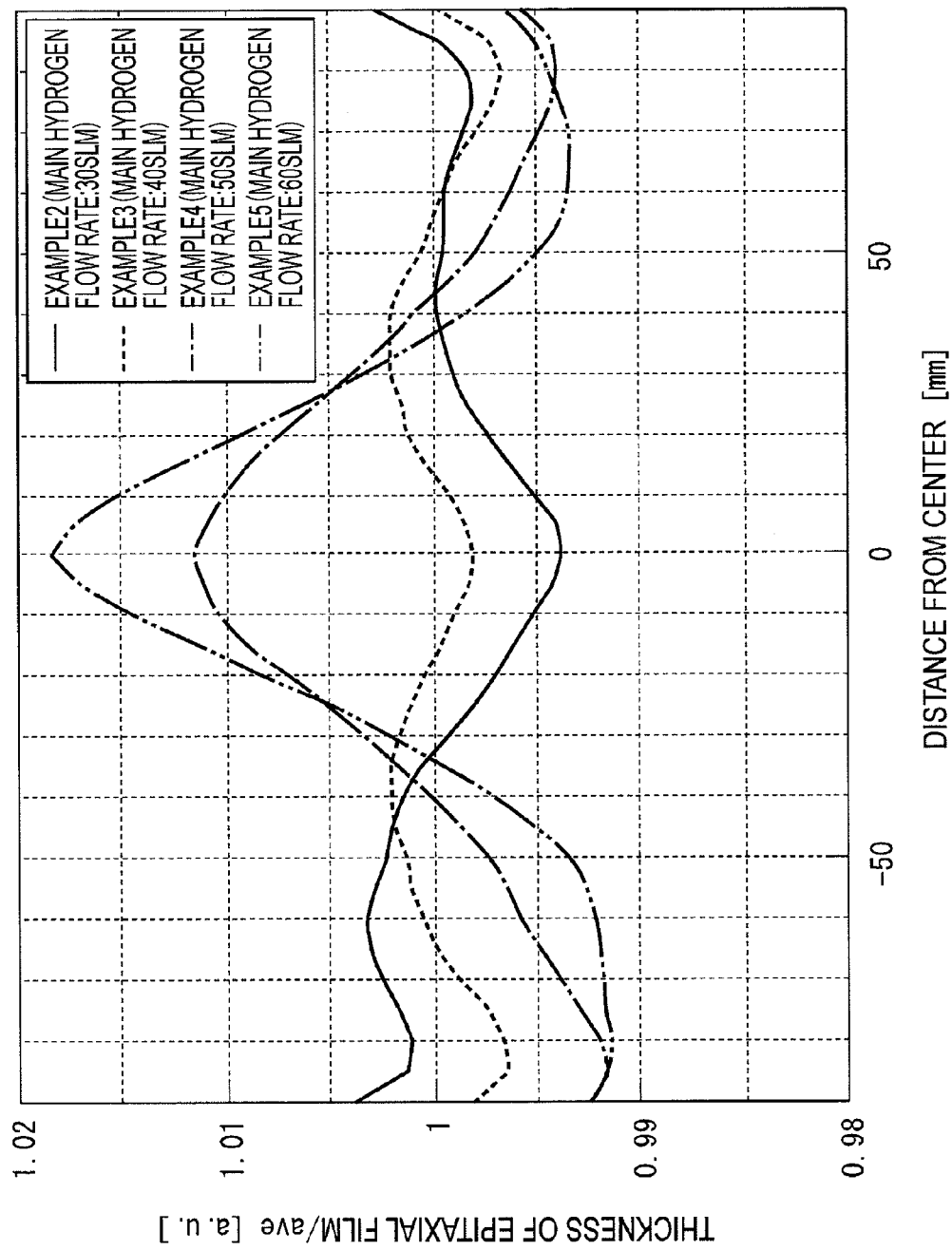
FIG. 4 is a graph showing a relationship between a flow rate of carrier hydrogen and the central thickness nonuniformity in a rod-adjacent structure according to the example.

As shown in FIG. 4, as the flow rate of the carrier hydrogen was increased (i.e., the flow rate of the reaction gas was increased), the central thickness of the epitaxial film and the thickness of the neighboring portion were increased. It has been found possible to change the central thickness of the epitaxial wafer from a thickness smaller than that of the neighboring portion to a thickness greater than that of the neighboring portion, by adjusting the flow rate of the carrier hydrogen in a range of 30 SLM to 60 SLM. Further, though generation of abnormal growth was found on the back surface of the sample according to Example 2, no abnormal growth was found in Examples 3 to 5.

Accordingly, by adjusting the flow rate of the carrier hydrogen to be 40 SLM or more, it has been found possible to adjust the thicknesses of the epitaxial film at positions within 50 mm radius from the center and to realize both the reduction in the central thickness nonuniformity and the prevention of the abnormal growth on the back surface.

{Relationship Between Positioning of Center Rod and Central Thickness Nonuniformity Under Film-Forming Condition for Reducing Central Thickness Nonuniformity in Rod-Adjacent Structure (Wafer Having Diameter of 200 mm)}

Figure 5:
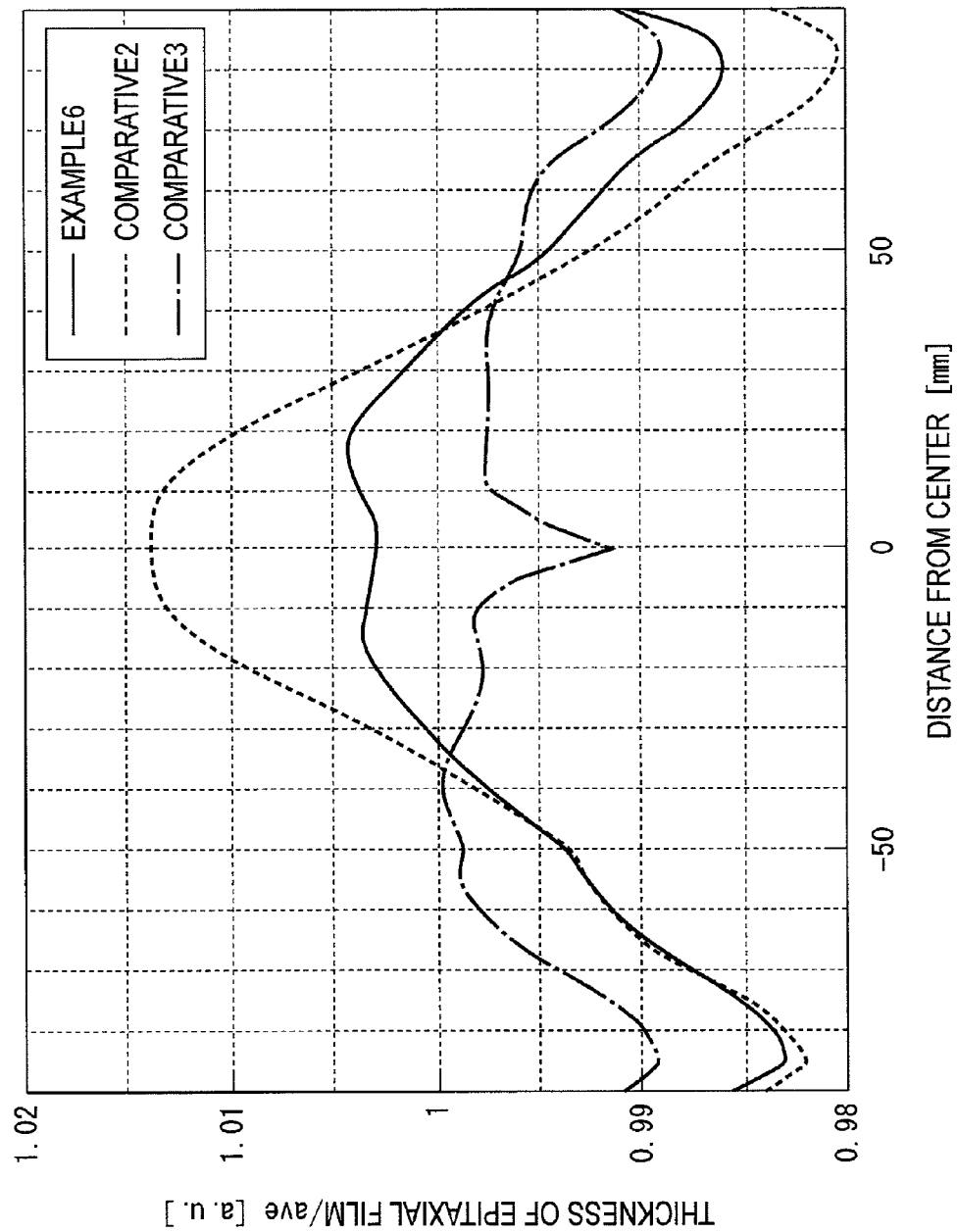
FIG. 5 is a graph showing a relationship between the positioning of the center rod and central thickness nonuniformity in a wafer having a diameter of 200 mm under a film-forming condition for reducing the central thickness nonuniformity in the rod-adjacent structure according to the example.

With use of the same apparatus as in Example 1, samples of Example 6 and Comparatives 2 and 3 were manufactured by processing wafers having a diameter of 200 mm under the conditions shown in Table 3 below. The conditions other than those shown in Table 3 were set to be the same conditions as applied to the sample of Example 1. Then, thickness indexes were obtained from the thicknesses of the epitaxial films exhibited at a plurality of positions. The results are shown in the graph of FIG. 5.

The flow rate of the carrier hydrogen shown in Table 3 was set such that, in the sample according to Example 6 adopting a rod-adjacent structure, the central thickness nonuniformity was reduced while no abnormal growth was generated on the back surface.

TABLE 3

|  | Example 6 (Rod-adjacent structure) | Comparative 2 (Three-Point Support Structure) | Comparative 3 (Four-Point Support Structure) |
| --- | --- | --- | --- |
| Center Rod | Provided | Not Provided | Provided |
| Center Rod Diameter (mm) | 4.7 | — | 4.7 |
| Temperature-Control Spaced Distance D (mm) | 6.7 | — | 0 (Surface Contact) |
| Contact Area of Center Rod and Susceptor (mm²) | — | — | $2.35^2 \pi$ |
| Flow Rate of Reaction Gas | Ha (SLM) | Ha (SLM) | Ha (SLM) |
| Flow Rate of Carrier Hydrogen (SLM) | 45 | 45 | 45 |
| Growth Time (Sec) | 176 | 176 | 124 |
| Flow Rate of Slit Hydrogen (SLM) | 15 | 15 | 20 |
| Growth Temperature | Ta (° C.) | Ta (° C.) | Ta (° C.) |

As shown in FIG. 5, when the flow rate of the carrier hydrogen was set such that the central thickness nonuniformity of Example 6 was reduced, the central thickness nonuniformity of Comparative 2 (three-point support structure) was increased with the epitaxial film being centrally thicker than the neighboring portion, and the central thickness of Comparative 3 (four-point support structure) was increased with the epitaxial film being locally centrally thinner than the neighboring portion.

Since there was no center rod in the three-point support structure, the radiation light was presumably irradiated on the susceptor central corresponding portion to raise the temperature thereof, which is considered to have resulted in increase in the central thickness of the epitaxial film. On the other hand, since the center rod was in surface contact with the susceptor central corresponding portion in the four-point support structure, the center rod presumably absorbed the heat at the surface contact portion and also blocked the radiation light to lower the temperature thereof, which is considered to have resulted in reduction in the central thickness of the epitaxial film.

{Relationship Between Positioning of Center Rod and Central Thickness Nonuniformity Under Film-Forming Condition for Reducing Central Thickness Nonuniformity in Rod-Adjacent Structure (Wafer Having Diameter of 300 mm)}

Figure 6:
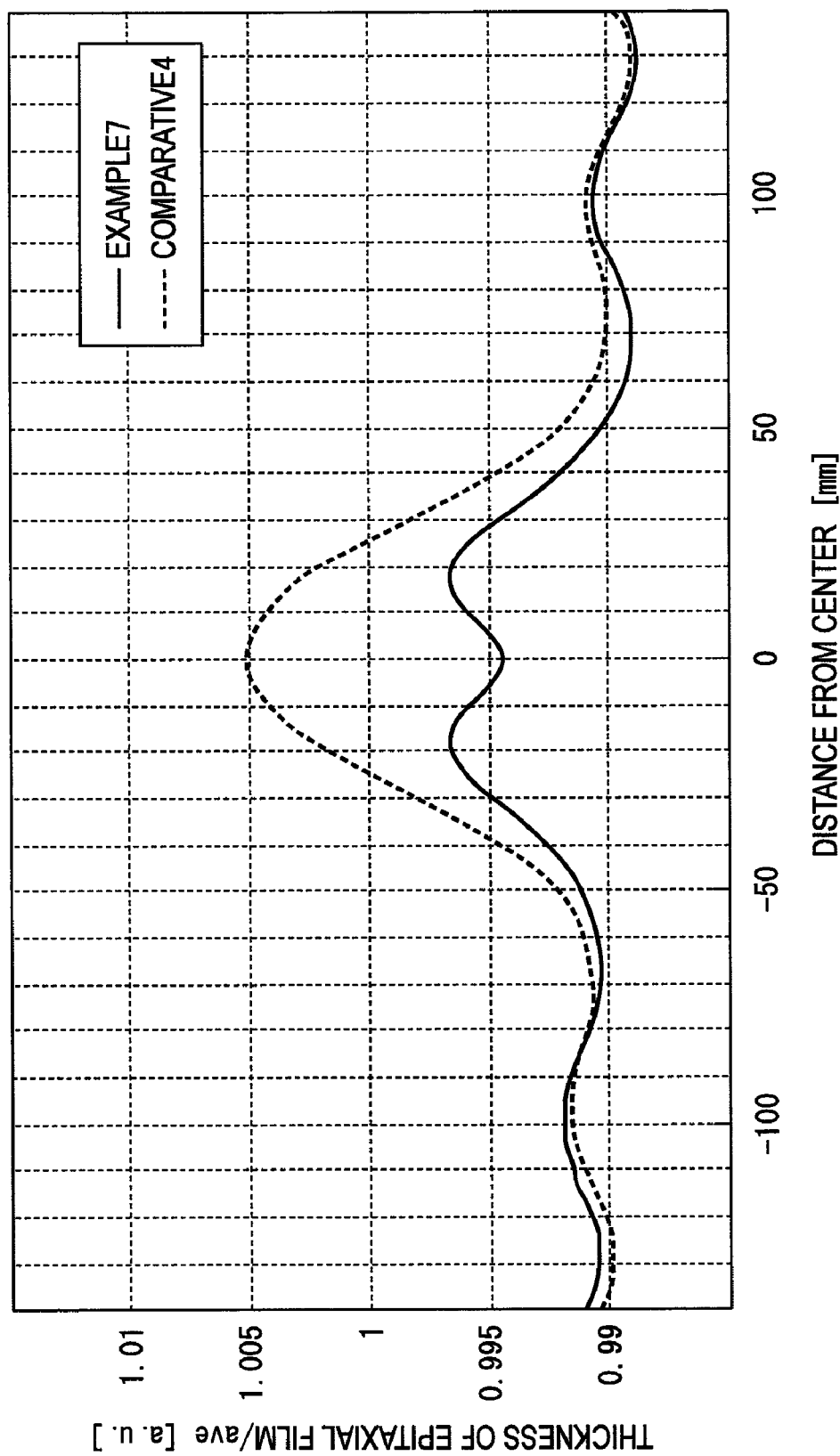
FIG. 6 is a graph showing a relationship between the positioning of the center rod and central thickness nonuniformity in a wafer having a diameter of 300 mm under a film-forming condition for reducing the central thickness nonuniformity in the rod-adjacent structure according to the example.

With use of the same apparatus as in Example 1, samples of Example 7 and Comparative 4 were manufactured by processing wafers having a diameter of 300 mm under the conditions shown in Table 4 below. The conditions other than those shown in Table 4 were set to be the same conditions as applied to the sample of Example 6. Then, thickness indexes were obtained from the thicknesses of the epitaxial films exhibited at a plurality of positions. The results are shown in the graph of FIG. 6.

The flow rate of the carrier hydrogen shown in Table 4 was set such that, in the sample according to Example 7 adopting a rod-adjacent structure, the central thickness nonuniformity was reduced while no abnormal growth was generated on the back surface.

TABLE 4

|  | Example 7 (Rod-adjacent structure) | Comparative 4 (Three-Point Support Structure) |
| --- | --- | --- |
| Center Rod | Provided | Not Provided |
| Center Rod Diameter (mm) | 20.5 | — |
| Temperature-Control Spaced Distance D (mm) | 6.7 | — |
| Flow Rate of Carrier Hydrogen (SLM) | 60 | 60 |
| Flow Rate of Reaction Gas | Hb (SLM) (more than Ha) | Hb (SLM) |
| Growth Temperature | Tb (° C.) (higher than Ta) | Tb (° C.) |

As shown in FIG. 6, the central thickness of the epitaxial film in Comparative 4 (three-point support structure) became greater than that of the neighboring portion under the flow rate of the carrier hydrogen set for reducing the central thickness nonuniformity of Example 7. In other words, the central thickness uniformity of Comparative 4 was increased.

Accordingly, it has been found possible to reduce the central thickness nonuniformity in the wafer having the diameter of 300 mm by setting the diameter of the center rod to be 20.5 mm.

Further, according to the results from the wafer having the diameter of 200 mm (FIG. 5) and the results from the wafer having the diameter of 300 mm (FIG. 6), it is presumably possible to reduce the central thickness nonuniformity in a wafer having a diameter of 450 mm by applying the invention to such a wafer.

{Relationship Between Temperature-Control Spaced Distance and Central Thickness Nonuniformity}

With use of the same apparatus as in Example 1, samples of Examples 8 to 14 were manufactured by processing wafers having a diameter of 200 mm under the conditions shown in Table 5 below. The conditions other than those shown in Table 5 were set to be the same conditions as applied to the sample of Example 6. Then, thickness indexes were obtained from the thicknesses of the epitaxial films exhibited at a plurality of positions. The results are shown in the graphs of FIGS. 7 and 8.

TABLE 5

| | Temperature-Control Spaced Distance D (mm) |
|---|---|
| Example 8 (Rod-adjacent structure) | 0.2 |
| Example 9 (Rod-adjacent structure) | 1.7 |
| Example 10 (Rod-adjacent structure) | 4.7 |
| Example 11 (Rod-adjacent structure) | 6.7 |
| Example 12 (Rod-adjacent structure) | 7.7 |
| Example 13 (Rod-adjacent structure) | 8.7 |
| Example 14 (Rod-adjacent structure) | 9.7 |

Figure 7:
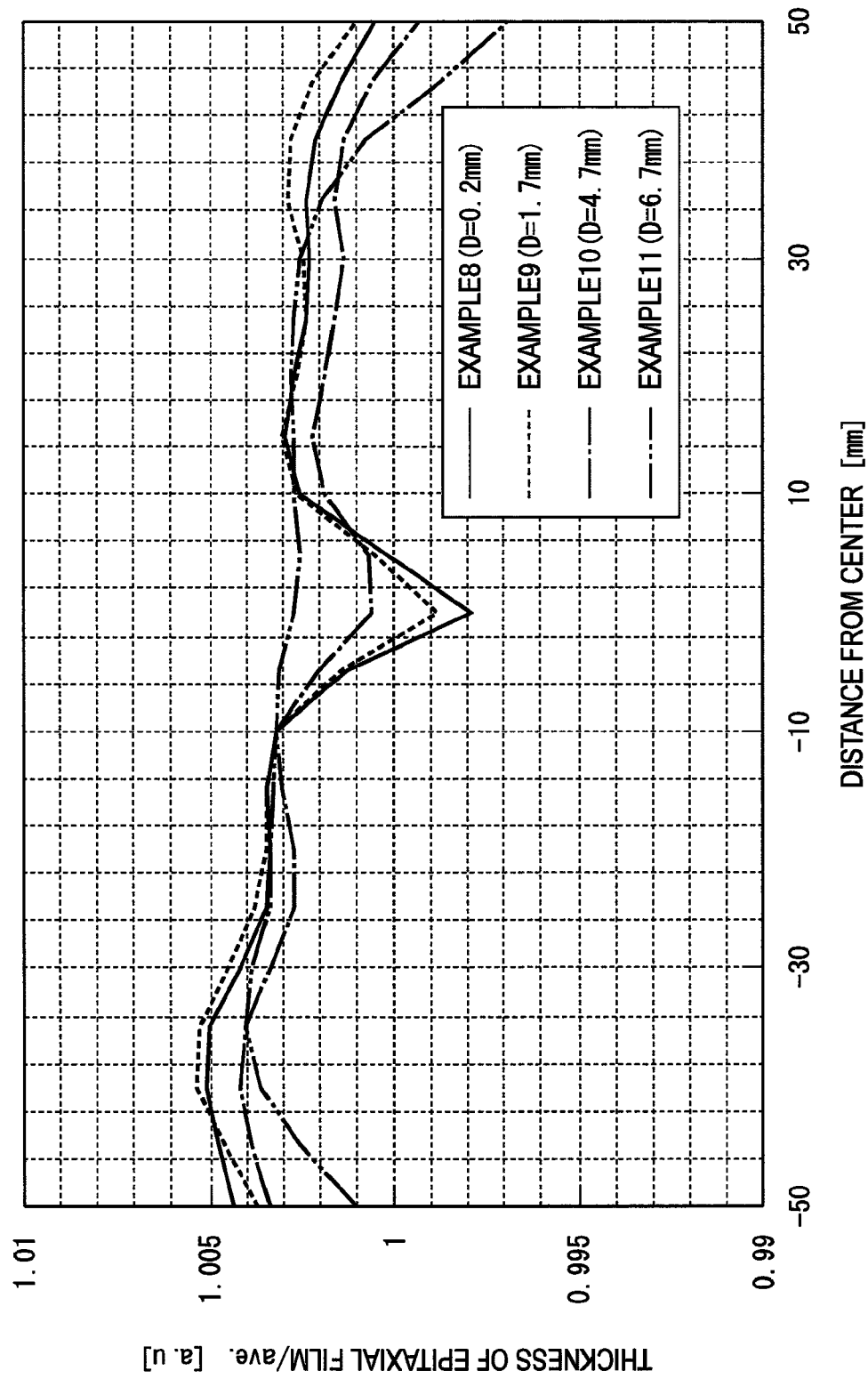
FIG. 7 is a graph showing a relationship between a temperature-control spaced distance and the central thickness nonuniformity in the example.
Figure 8:
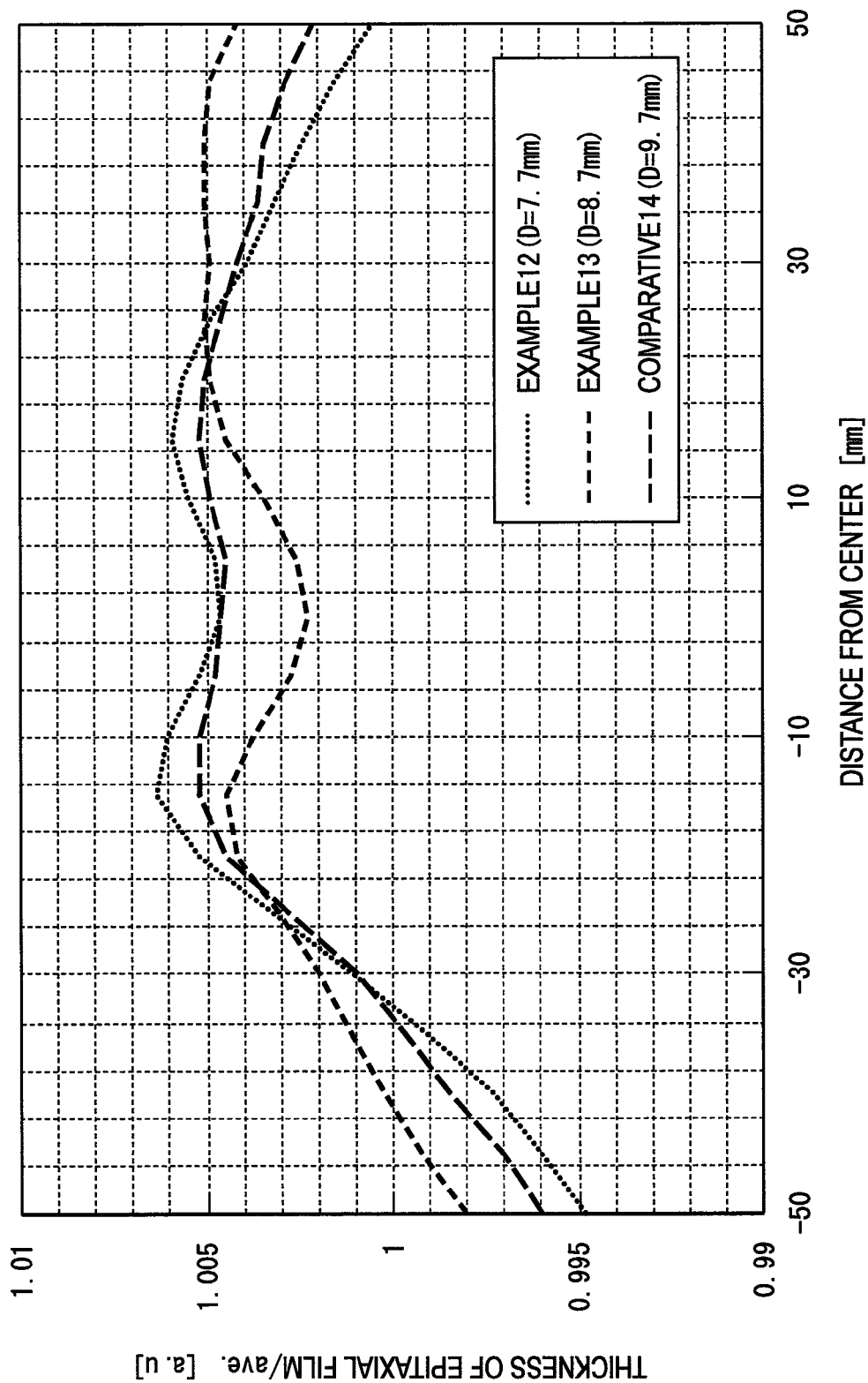
FIG. 8 is a graph showing the relationship between a temperature-control spaced distance and the central thickness nonuniformity in the example.

As shown in FIGS. 7 and 8, as the temperature-control spaced distance D was increased, the epitaxial film became centrally thick, thereby leading to reduction in the central thickness nonuniformity.

{Relationship Between Temperature-Control Spaced Distance and Central Recess}

Figure 9:
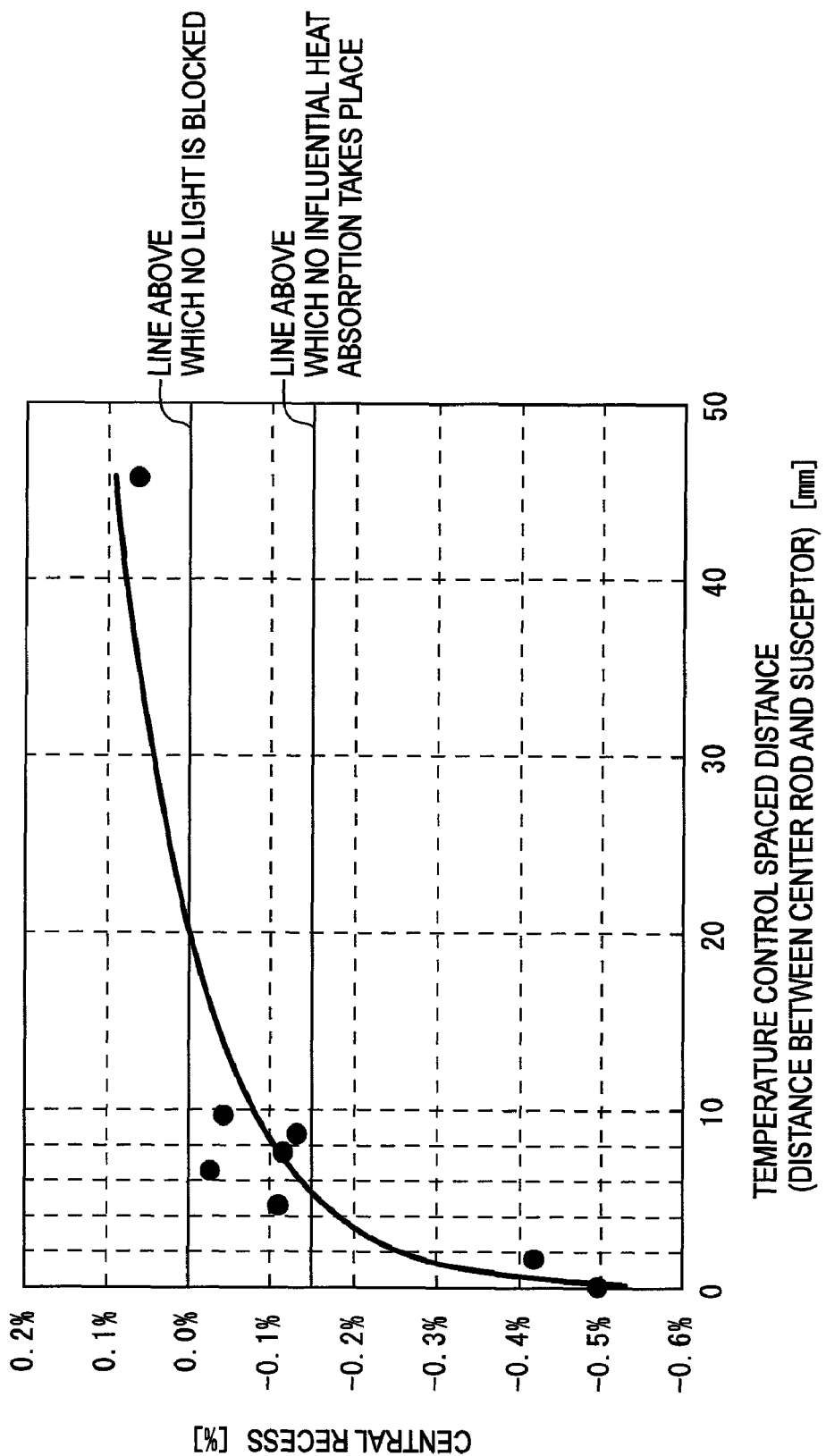
FIG. 9 is a graph showing a relationship between the temperature-control spaced distance and a central recess in the example.

With use of the same apparatus as in Example 1, samples were manufactured by processing wafers having a diameter of 200 mm with the temperature-control spaced distance D being set to values indicated on the horizontal axis in FIG. 9.

The conditions other than the temperature-control spaced distance D were set to be the same conditions as applied to the samples of Examples 8 to 14. Then, thicknesses of the epitaxial films were measured at a plurality of positions, and the central recess was obtained in accordance with the following formula (1). The results are shown in the graph of FIG. 9.

$$\text{Central recess (\%)} = (M0 - M10)/\text{AVE} \quad (1)$$

M10: Thickness of epitaxial film at position +10 mm away from wafer center
M0: Central thickness of epitaxial film
AVE: Average value of overall wafer thickness As shown in FIG. 9, by setting the temperature-control spaced distance D to be 4 mm or more, the central recess became −0.15% or more. Thus, it was found possible to suppress the heat from being greatly absorbed by the center rod and to prevent the temperature from being locally lowered. Further, by setting the temperature-control spaced distance D to be 20 mm or less, the central recess became 0% or less. Thus, it was found possible to suppress reduction in the light-blocking capability of the center rod and to prevent the temperature at the susceptor central corresponding portion from becoming higher than that of the other portion. Accordingly, it has been found that, by setting the temperature-control spaced distance D to be 4 mm to 20 mm, the central thickness nonuniformity is considerably reduced.

{Relationship Between Presence of Center Rod, in-Plane Thickness Distribution Of Epitaxial Film and Average Thickness of Epitaxial Film Under Film-Forming Condition for Reducing Central Thickness Nonuniformity in Rod-Adjacent Structure}

Figure 10:
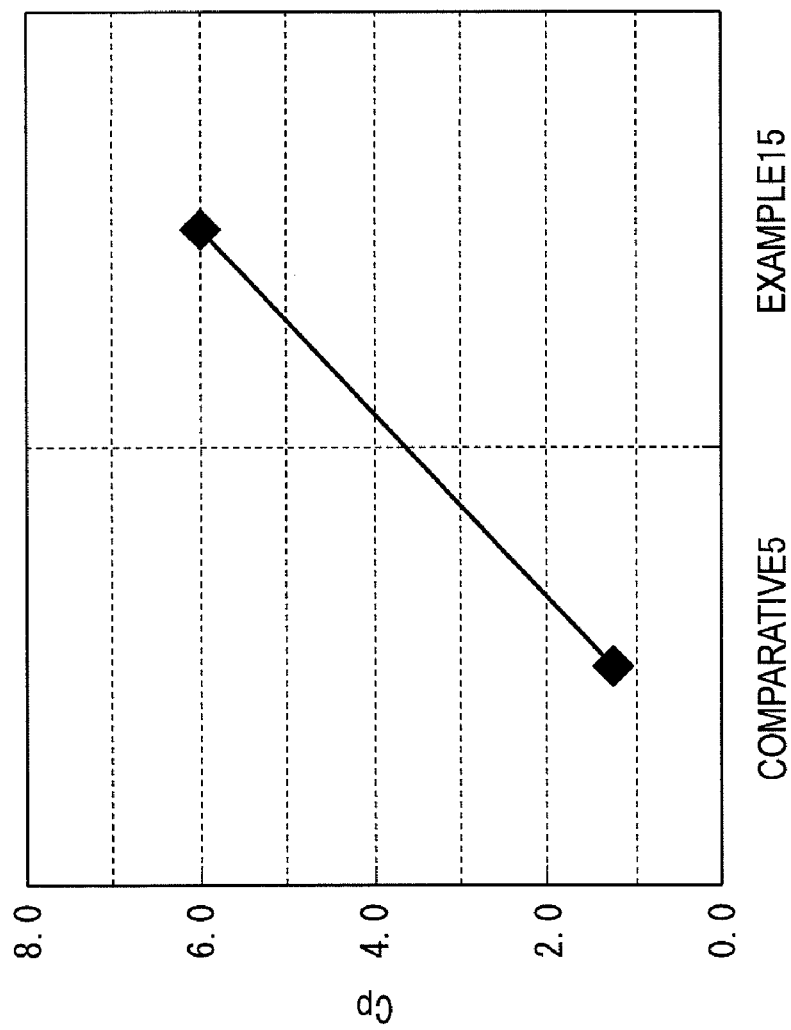
FIG. 10 is a graph showing a relationship between the presence of the center rod and a process capability index Cp of in-plane thickness distribution of the epitaxial film thickness under a film-forming condition for reducing the central thickness nonuniformity in the rod-adjacent structure according to the example.
Figure 11:
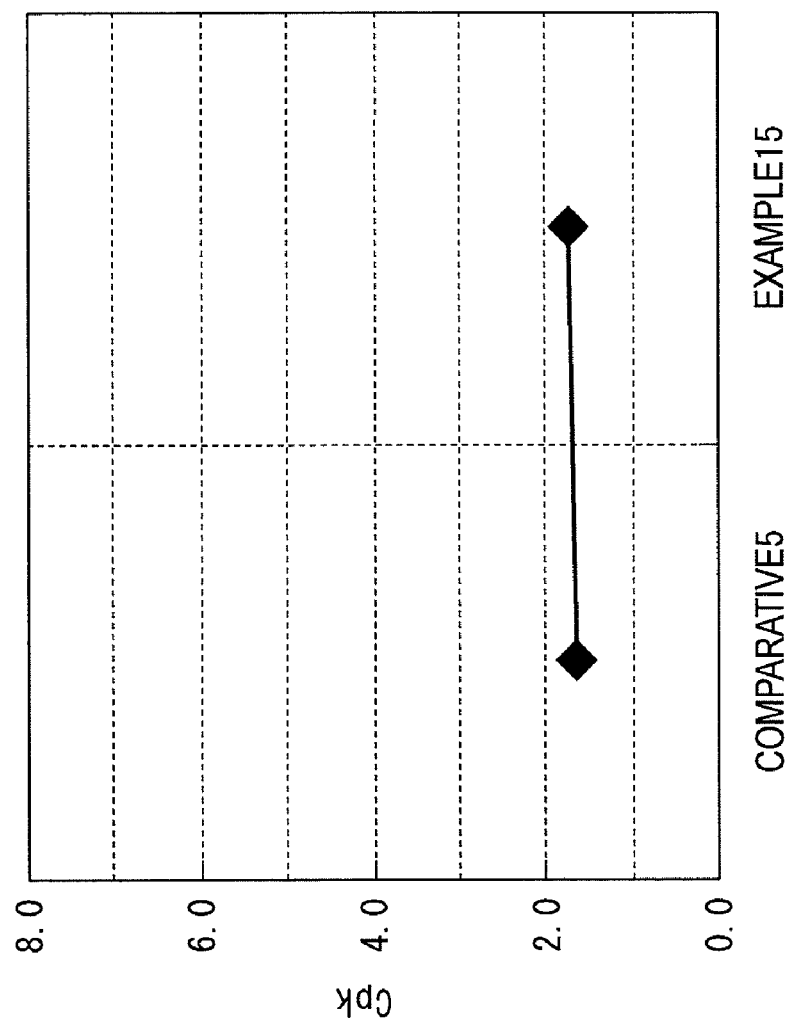
FIG. 11 is a graph showing a relationship between the presence of the center rod and a process capability index Cpk of average values of the epitaxial film thickness under a film-forming condition for reducing the central thickness nonuniformity in the rod-adjacent structure according to the example.

With use of an apparatus differing from the manufacturing apparatus of Example 1, eleven samples of Example 15 and eight samples of Comparative 5 were manufactured by processing wafers having a diameter of 200 mm under the conditions shown in Table 6 below. The conditions other than those shown in Table 6 were set to be the same conditions as applied to the sample of Example 6. Then, process capability indexes Cp of in-plane thickness distributions of the epitaxial films in Example 15 and Comparative 5 were obtained. The results are shown in the graph of FIG. 10. Also, process capability indexes Cpk of average thicknesses of the epitaxial films in Example 15 and Comparative 5 were obtained. The results are shown in the graph of FIG. 11.

TABLE 6

| | Example 15 (Rod-adjacent structure) | Comparative 5 (Three-Point Support Structure) |
|---|---|---|
| Center Rod | Provided | Not Provided |
| Center Rod Diameter (mm) | 4.7 | — |
| Temperature-Control Spaced Distance D (mm) | 6.7 | — |
| Flow Rate of Reaction Gas | Hc (SLM) (more than Ha but less than Hb) | Hc (SLM) |
| Flow Rate of Carrier Hydrogen (SLM) | 40 | 40 |
| Growth Time (Sec) | 91.5 | 91.5 |
| Flow Rate of Slit Hydrogen (SLM) | 15 | 15 |
| Growth Temperature | Ta (° C.) | Ta (° C.) |

As shown in FIG. 10, Example 15 adopting the rod-adjacent structure exhibited greater process capability index Cp of the in-plane thickness distribution than Comparative 5 adopting the three-point support structure. As shown in FIG. 11, Comparative 5 and Example 15 exhibited substantially equal process capability index Cpk of the average thickness.

Accordingly, by adopting the rod-adjacent structure, it has been found possible to make the average thickness of the epitaxial film substantially equal to that in the three-point support structure and also to make the central thickness nonuniformity smaller than that in the three-point support structure.

{Relationship Between Transparency of Center Rod and Film-Forming Conditions}

Figure 12:
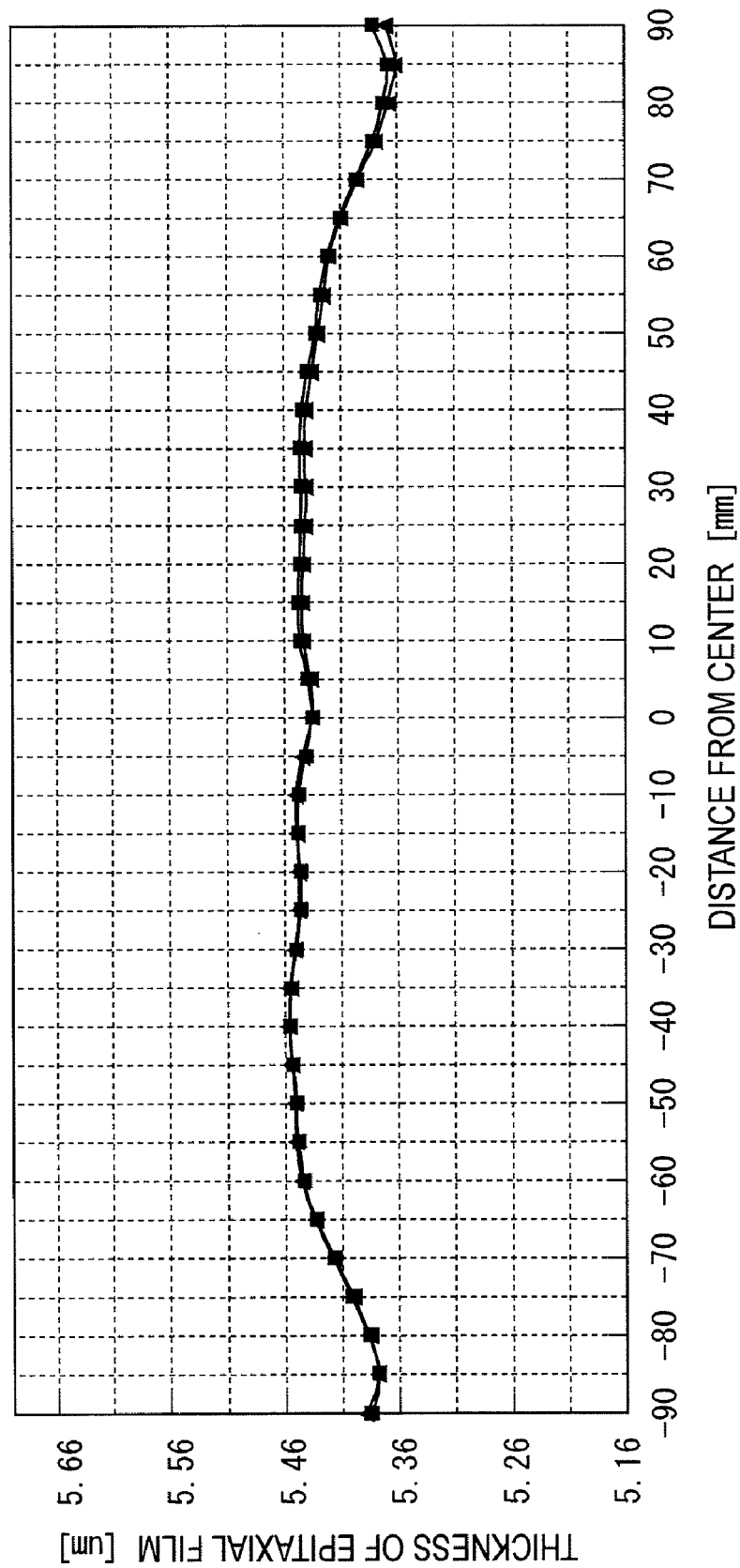
FIG. 12 is a graph showing a film thickness distribution when the center rod is naturally devitrified in the example.
Figure 13:
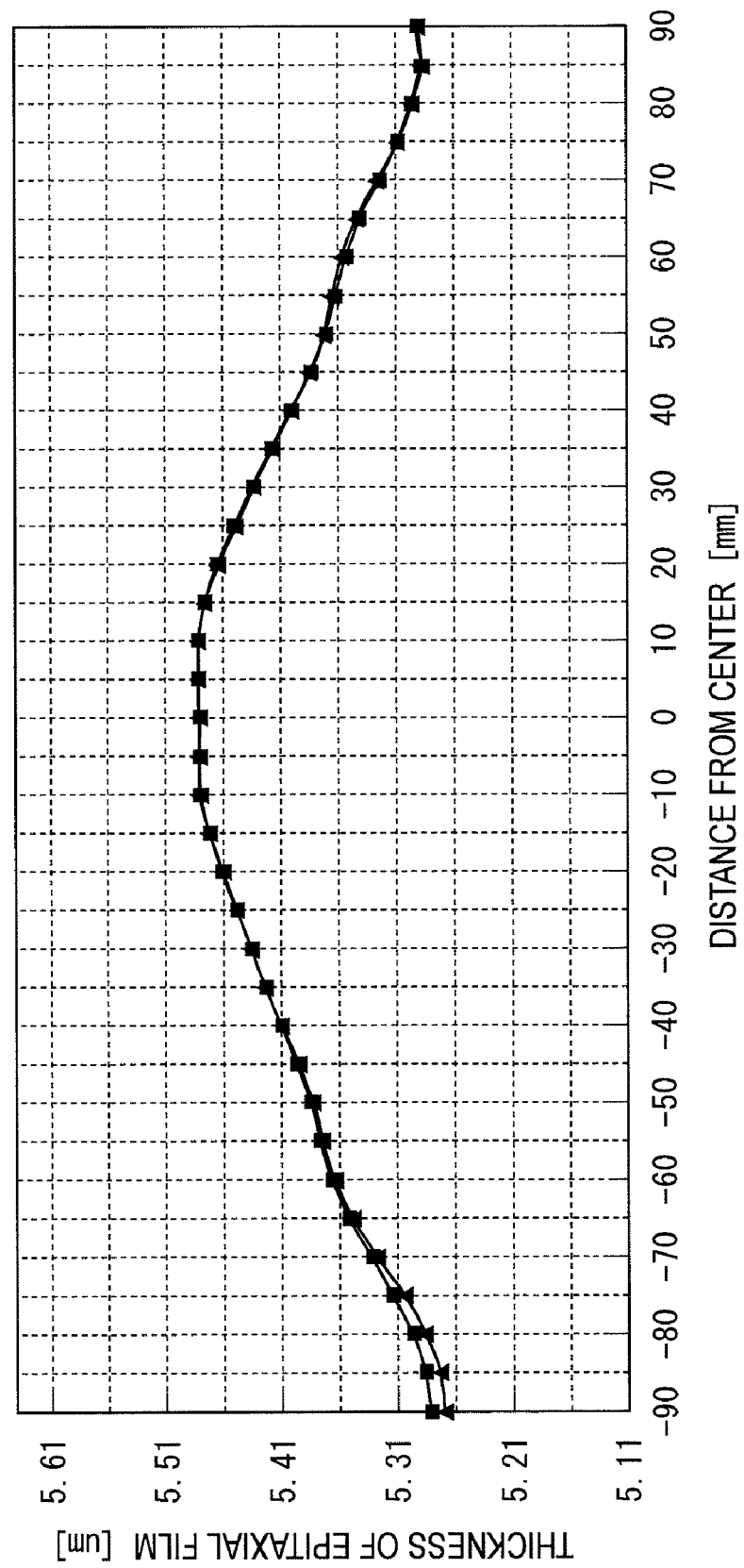
FIG. 13 is a graph showing a film thickness distribution when the center rod is substantially transparent in the example.
Figure 14:
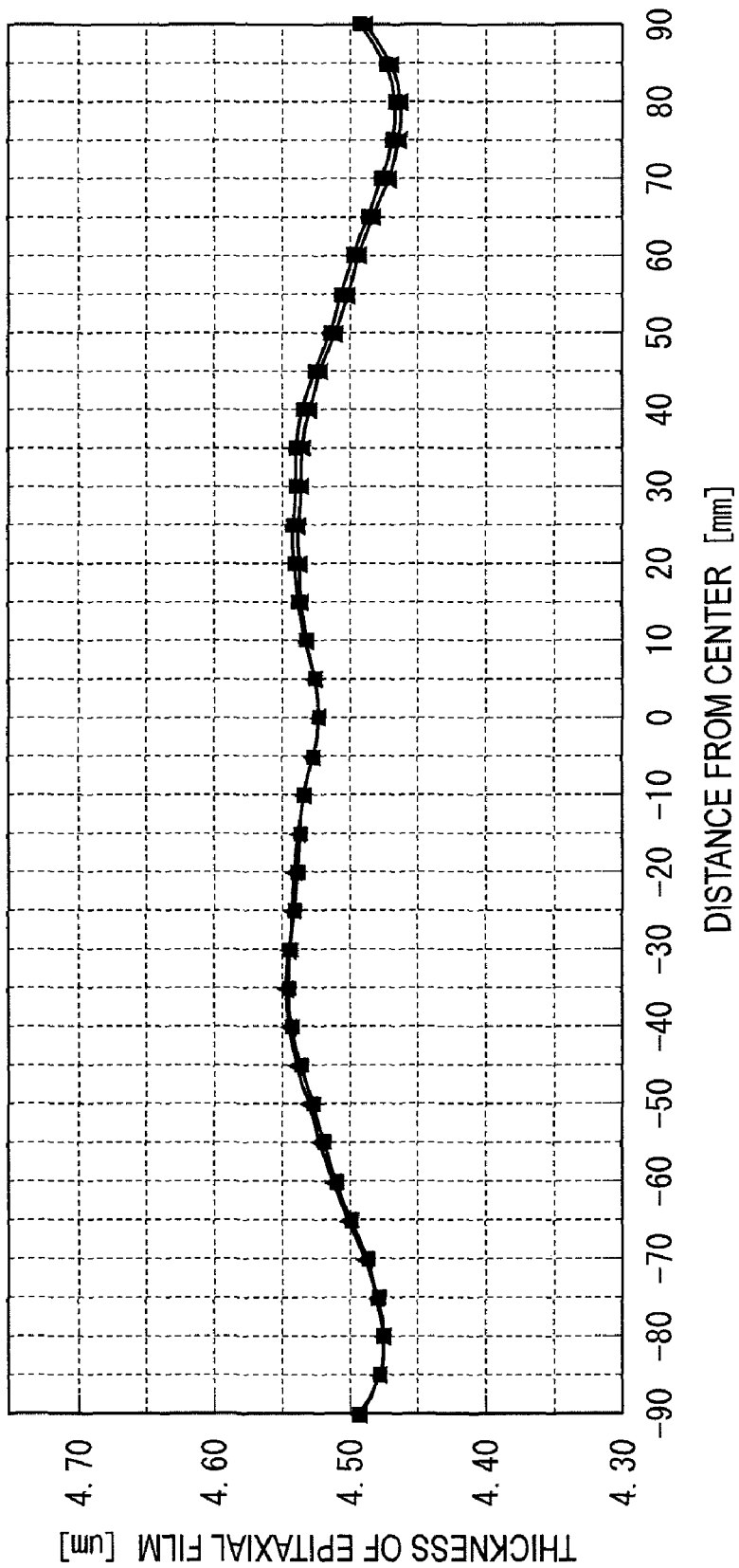
FIG. 14 is a graph showing a film thickness distribution when the center rod is substantially transparent and the flow rate of reaction gas is reduced in the example.

With use of the same apparatus as in Examples 1 and 15, samples of Examples 16 to 18 were manufactured by processing wafers having a diameter of 200 mm under the conditions shown in Table 7 below. The samples were manufactured under the same conditions as those for the sample of Example 6 except that the conditions shown in Table 7 were applied and that a non-sandblasted center rod was used. Then, the thicknesses of the epitaxial films according to Examples 16 to 18 were measured. The results are shown in the graphs of FIGS. 12 to 14.

TABLE 7

| | Example 16 (Rod-adjacent structure) | Example 17 (Rod-adjacent structure) | Example 18 (Rod-adjacent structure) |
|---|---|---|---|
| Center Rod | Provided | Provided | Provided |
| Center Rod Diameter (mm) | 4.7 | 4.7 | 4.7 |
| Surface Treatment of Center Rod | None (Etched by Process Gas Etching) | None | None |
| Transparency of Center Rod | Naturally Devitrified | Substantially Transparent | Substantially Transparent |
| Temperature-Control Spaced Distance D (mm) | 6.7 | 6.7 | 6.7 |

TABLE 7-continued

|  | Example 16 (Rod-adjacent structure) | Example 17 (Rod-adjacent structure) | Example 18 (Rod-adjacent structure) |
|---|---|---|---|
| Flow Rate of Reaction Gas | Hd (SLM) (more than Ha but less than Hb & Hc) | Hd (SLM) | He (SLM) (less than Ha, Hb, Hc & Hd) |
| Flow Rate of Carrier Hydrogen (SLM) | 40 | 45 | 30 |
| Growth Time (Sec) | 124 | 124 | 124 |
| Concentration of Reaction Gas | Na (%) | Nb (%) (less than Na) | Nc (%) (less than Na & Nb) |
| Flow Rate of Slit Hydrogen (SLM) | 20 | 20 | 15 |
| Total Flow Rate | Sa (SLM) | Sb (SLM) (Sa + 5 (SLM)) | Sc (SLM) (Sa-about 10 (SLM)) |

As shown in Table 7, by etching the center rod capable of blocking the radiation light (i.e., rod formed by etching a transparent center rod in the process gas and naturally devitrified) in mixed acids, the center rod became substantially transparent.

Also as shown in FIGS. 12 and 13, Example 17 using the substantially transparent center rod exhibited greater central thickness nonuniformity than Example 16 using the naturally-devitrified center rod. As is understood from Table 7, although the total flow rate of Example 17 was set higher than that of Example 16 by 5 (SLM), the flow rate of the carrier hydrogen optimum for reducing the central thickness nonuniformity was reduced by an amount more than that amount.

Specifically, as shown in FIGS. 12 and 14 and Table 7, for substantially equalizing the central thickness nonuniformity of Examples 16 and 18, it has been found effective to reduce the total flow rate of Example 16 by approximately 10 (SLM) as in Example 18. In other words, it is understood that the substantially transparent center rod was less capable of blocking the light than the naturally-devitrified center rod.

Based on the above, when transparency of the center rod has been increased due to cleaning during a maintenance or the like but the wafers are manufactured continuously at the same flow rate of the carrier hydrogen, changes are brought to the central thickness of the epitaxial wafers, thereby increasing the central thickness nonuniformity.

Specifically, even when a transparent center rod is used, such a center rod is gradually etched by the gas used for vapor-phase etching of the wafers and gradually reduces its transparency in the course of the repeated manufacturing process (i.e., center rod becomes more capable of blocking the light). Hence, in order to suppress the change in the transparency of the center rod as much as possible irrespective of the repetition of the manufacturing process, the surface of the center rod is found required to be sufficiently roughened and devitrified by a method such as sandblasting.

[Second Exemplary Embodiment]

The second exemplary embodiment of the invention will be described below with reference to the attached drawings.

The same structures as in the first exemplary embodiment will be denoted by the same numerals, description of which will be omitted or simplified.

[Structure of Manufacturing Apparatus of Epitaxial Wafer]

Figure 15:
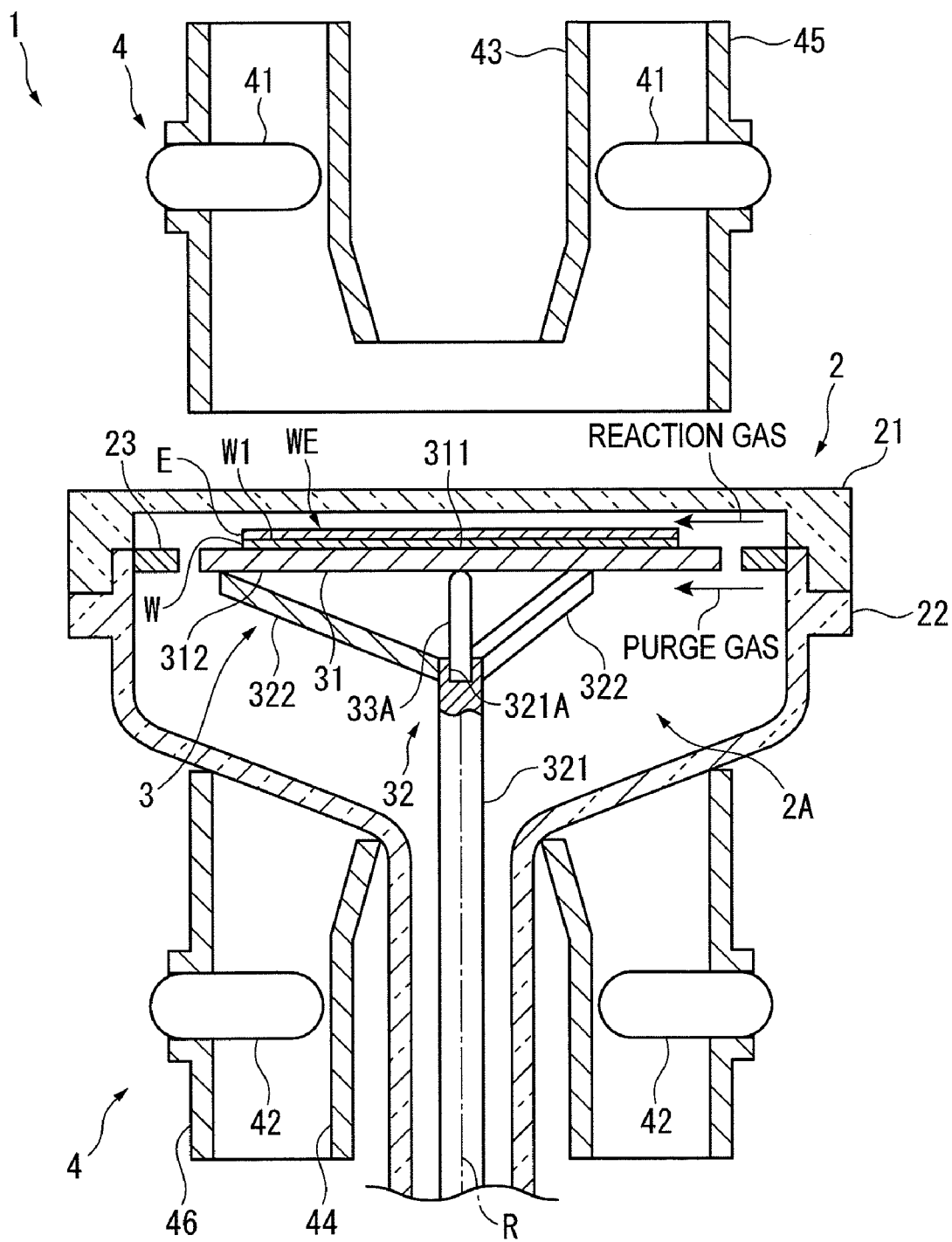
FIG. 15 is a cross sectional view showing a primary portion of manufacturing apparatus of epitaxial wafers according to a second exemplary embodiment of the invention.

FIG. 15 is a cross sectional view showing a primary portion of the manufacturing apparatus of epitaxial wafers according to this exemplary embodiment. FIG. 2 is a plan view showing the manufacturing apparatus of epitaxial wafers.

A surface of the support body 321 near its upper end is provided with the rod-fitting recess 321A to which a lower end of a center rod 33A is detachably fitted. The center rod 33A, which is made of a transparent material (e.g., quartz) and shaped substantially in cylinder having a semispherical distal end, is fitted to the rod-fitting recess 321A at its lower end to extend in a direction substantially orthogonal to the non-mounting surface 312 (i.e., up-and-down direction) on the side of the non-mounting surface 312 of the susceptor 31. In addition, the front surface of the center rod 33A is roughened by sandblasting. The length of the center rod 33A is sized such that the upper end of the center rod 33A is in point contact with the center of the non-mounting surface 312. Further, the center rod 33A exhibits a diameter of 3.0 mm to 22.0 mm at its portion that is not fitted to the rod-fitting recess 321A. The diameter of the center rod 33A is set in accordance with the diameter of the wafer W. In other words, the diameter of the center rod 33A is exemplarily set at 4.7 mm when the diameter of the wafer W is 200 mm, or at 20.5 mm when the diameter of the wafer W is 300 mm.

[Manufacturing Method of Epitaxial Wafer]

Next, a method of manufacturing the epitaxial wafer WE with use of the above-described manufacturing apparatus 1 will be described.

The back emitting heaters 42 are substantially annularly positioned. Thus, when no center rod 33A is provided, the susceptor 31 is irradiated with the radiation light from the back emitting heaters 42 in a larger amount at its central portion than at its periphery, so that the susceptor 31 exhibits a higher temperature at its central portion than at its periphery.

On the other hand, since the manufacturing apparatus 1 includes the center rod 33A to be in point contact with the center of the susceptor 31, the heat is absorbed by the center rod 33A at the point-contact portion and the temperature is lowered. As compared to the configuration where the center rod and the susceptor are to be in such surface contact that the contact area occupies, for instance, more than 0.05% of the wafer area, the heat absorption due to the contact can be reduced, thereby suppressing the temperature of the susceptor 1 from being lowered locally at the central portion.

Hence, as compared to a configuration provided with no center rod 33A, the susceptor 31 can be heated while the temperature at the central portion is properly controlled. Therefore, without greatly reducing the amount of the reaction gas, the vapor-phase grown epitaxial film E can exhibit reduction in central thickness nonuniformity.

[Advantages of Second Exemplary Embodiment]

The above-described exemplary embodiments can provide the following advantages.

(6) In the manufacturing apparatus 1, the center rod 33A extends in the up-and-down direction on the side of the non-mounting surface 312 of the susceptor 31 to be in point contact with the center of the susceptor 31 (susceptor-center-corresponding portion) at its upper end.

Accordingly, as described above, the central thickness nonuniformity can be reduced without greatly reducing the amount of the reaction gas, and abnormal growth on the back surface of the epitaxial wafer WE can be prevented.

(7) Since the upper end of the center rod 33A is semispherical, the center rod 33A and the susceptor 31 can be brought into point contact with each other without any fine positioning adjustment.

(8) The center rod 33A is detachably attached to the support body 321 of the periphery support 32. Thus, by replacing the center rod 33A before being so much etched by hydrochloric gas as to greatly change its contact area, the heat absorption can be made substantially constant. Accordingly, the epitaxial wafer WE of stable quality can be manufactured.

[Other Exemplary Embodiments]

The invention is not limited to the above-described first and second exemplary embodiments, but may include various improvements and modifications as long as they are compatible with the invention.

As long as the center rod 33 in the first exemplary embodiment is substantially rod-shaped, its entirety or upper end portion may be shaped in a polygonal column, circular cylinder, angled cylinder, circular cone or pyramid. The center rod 33 made of a transparent material such as quartz may not be sandblasted, or the center rod 33 may be made of a non-transparent material such as opaque quartz and SiC (silicon carbide). The center rod 33 and the periphery support 32 may be integrated together, so that the center rod 33 is not detachable from the periphery support 32.

When the film is to be grown on the wafer W non-concentrically mounted on the susceptor 31 in the first exemplary embodiment, the upper end of the center rod 33 may come close to the non-mounting surface 312 at a position spaced from the center of the non-mounting surface 312 and corresponding to the center of the wafer W, instead of a position corresponding to the center of the non-mounting surface 312. With this arrangement, the same advantages as in the first exemplary embodiment can be obtained.

The temperature-control spaced distance D and the diameter of the center rod 33 in the first exemplary embodiment are not required to limitedly take the above-described values, but may take any other suitable values.

Figure 16:
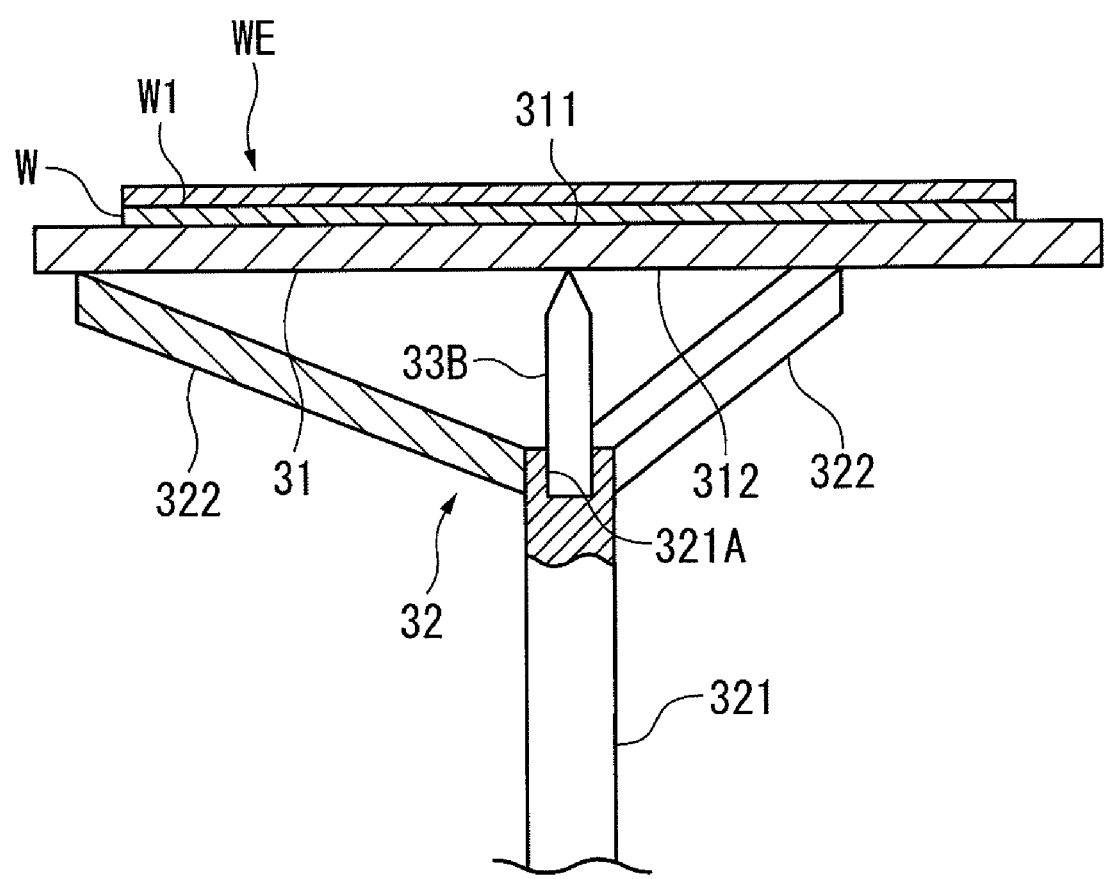
FIG. 16 is a lateral view showing a center rod according to a modification of the second exemplary embodiment of the invention.

As shown in FIG. 16, the second exemplary embodiment may be modified such that a substantially rod-shaped center rod 33B having a conical upper end is in point contact with the susceptor 31. The shape of the upper end may alternatively be pyramid.

Figure 17:
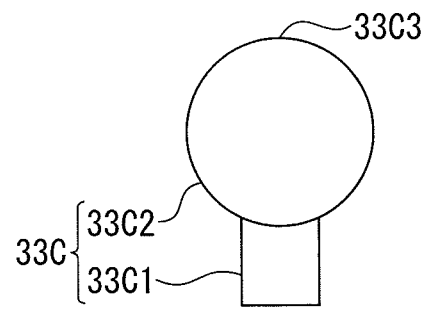
FIG. 17 is a lateral view showing a center rod according to another modification of the second exemplary embodiment of the invention.

Further, as shown in FIG. 17, the second exemplary embodiment may alternatively use a substantially rod-shaped center rod 33C including: a cylinder 33C1; and a spherical portion 33C2 provided on the distal end of the cylinder 33C1, and a distal end 33C3 of the spherical portion 33C2 may be in point contact with the susceptor 31.

Figure 18:
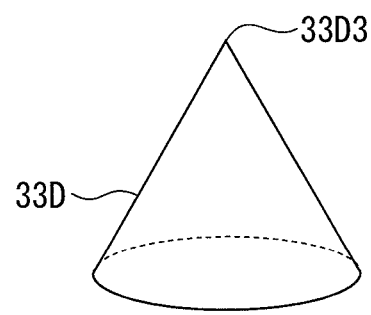
FIG. 18 is a perspective view showing a center rod according to still another modification of the second exemplary embodiment of the invention.

As shown in FIG. 18, the second exemplary embodiment may further alternatively use a substantially conical center rod 33D as a substantially rod-shaped center rod, and a distal end 33D3 thereof may be in point contact with the susceptor 31.

Figure 19:
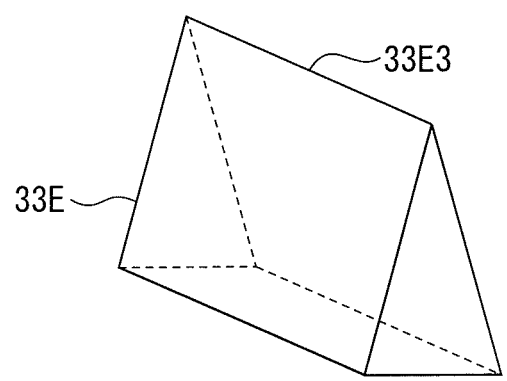
FIG. 19 is a lateral view showing a center rod according to further modification of the second exemplary embodiment of the invention.

As shown in FIG. 19, the second exemplary embodiment may further alternatively use a center rod 33E of which vertical cross section is shaped substantially in a triangular wall, and a distal end 33E3 thereof may be in line contact with the susceptor 31.

Still further alternatively, the second exemplary embodiment may be modified such that a substantially rod-shaped temperature control member having an arcate upper end is in line contact with the susceptor 31.

In the second exemplary embodiment, the center rod 33A made of a transparent material such as quartz may not be sandblasted, or the center rod 33A may be made of a non-transparent material such as opaque quartz and SiC (silicon carbide). The center rod 33A and the periphery support 32 may be integrated together, so that the center rod 33A is not detachable from the periphery support 32.

When the film is to be grown on the wafer W non-concentrically mounted on the susceptor 31 in the second exemplary embodiment, the upper end of the center rod 33A may be substantially in point contact or line contact with the non-mounting surface 312 at a position spaced from the center of the non-mounting surface 312 and corresponding to the center of the wafer W, instead of a position corresponding to the center of the non-mounting surface 312. With this arrangement, the same advantages as in the second exemplary embodiment can be obtained.

What is claimed is:

1. A susceptor device for use to hold a material wafer in a manufacturing apparatus of an epitaxial wafer, the manufacturing apparatus irradiating radiation light toward the material wafer from a back surface side opposite to a film-forming surface of the material wafer to heat the material wafer, the manufacturing apparatus manufacturing the epitaxial wafer by growing an epitaxial film in vapor phase on the film-forming surface while the material wafer is heated, the susceptor device comprising:

a susceptor having a mounting surface on which the material wafer is mounted;

a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape and extending in a direction substantially orthogonal to a non-mounting surface on a side of the non-mounting surface opposite to the mounting surface, an end of the temperature controller being adjacent to a portion of the non-mounting surface without contacting, the portion of the non-mounting surface corresponding to the center of the material wafer.

2. The susceptor device according to claim 1, wherein a distance between the end of the temperature controller and the non-mounting surface is set to be 4 mm to 20 mm.

3. The susceptor device according to claim 1, wherein the temperature controller is treated so that its front surface reflects the radiation light.

4. The susceptor device according to claim 1, wherein the temperature controller is made of a non-transparent material.

5. The susceptor device according to claim 1, wherein the temperature controller is detachably attached to the periphery support.

6. The susceptor device according to claim 1, wherein the temperature controller has a diameter of 3.0 mm to 22.0 mm.

7. A manufacturing apparatus of an epitaxial wafer that manufactures the epitaxial wafer by growing an epitaxial film in vapor phase on a film-forming surface of a material wafer, the manufacturing apparatus comprising:

the susceptor device according to claim 1 for holding the material wafer;

a reaction container in which the susceptor device is placed, the reaction container capable of internally supplying reaction gas for growing the epitaxial film in vapor phase on the film-forming surface of the material wafer; and a back emitting heater that irradiates radiation light toward the material wafer from a back surface side opposite to the film-forming surface of the material wafer and heats the material wafer.

8. A method of manufacturing an epitaxial wafer, comprising:

mounting a material wafer on a susceptor device for holding the material wafer;

irradiating radiation light toward the material wafer from a back surface side opposite to a film-forming surface of the material wafer to heat the material wafer;

supplying reaction gas to the material wafer while the material wafer is heated; and growing an epitaxial film in vapor phase on the film-forming surface, the susceptor device comprising: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape and extending in a direction substantially orthogonal to a non-mounting surface on a side of the non-mounting surface opposite to the mounting surface, an end of the temperature controller being adjacent to a portion of the non-mounting surface without contacting, the portion of the non-mounting surface corresponding to the center of the material wafer, the temperature controller controlling the temperature of the portion of the susceptor corresponding to the center of the material wafer by blocking the radiation light.

9. A susceptor device for use to hold a material wafer in a manufacturing apparatus of an epitaxial wafer, the manufacturing apparatus irradiating radiation light toward the material wafer to heat the material wafer, the manufacturing apparatus manufacturing the epitaxial wafer by growing an epitaxial film in vapor phase on a film-forming surface of the material wafer while the material wafer is heated, the susceptor device comprising:

a susceptor having a mounting surface on which the material wafer is mounted;

a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape or a substantially plate shape and extending in a direction substantially orthogonal to a non-mounting surface on a side of the non-mounting surface opposite to the mounting surface, an end of the temperature controller being substantially in point contact or line contact with a portion of the non-mounting surface, the portion of the non-mounting surface corresponding to the center of the material wafer.

10. The susceptor device according to claim 9, wherein the end of the temperature controller is conical, pyramidal or semispherical and substantially in point contact with the non-mounting surface.

11. The susceptor device according to claim 9, wherein the temperature controller is detachably attached to the periphery support.

12. A manufacturing apparatus of an epitaxial wafer that manufactures the epitaxial wafer by growing an epitaxial film in vapor phase on a film-forming surface of a material wafer, the manufacturing apparatus comprising:

the susceptor device according to claim 9 for holding the material wafer;

a reaction container in which the susceptor device is placed, the reaction container capable of internally supplying reaction gas for growing the epitaxial film in vapor phase on the film-forming surface of the material wafer; and an emitting heater that irradiates radiation light toward the material wafer and heats the material wafer.

13. A method of manufacturing an epitaxial wafer, comprising:

mounting a material wafer on a susceptor device for holding the material wafer;

irradiating radiation light toward the material wafer to heat the material wafer;

supplying reaction gas to the material wafer while the material wafer is heated; and growing an epitaxial film in vapor phase on a film-forming surface of the material wafer, the susceptor device comprising: a susceptor having a mounting surface on which the material wafer is mounted; a periphery support that supports a periphery adjacent portion of the susceptor; and a temperature controller that controls a temperature of a portion of the susceptor, the portion of the susceptor corresponding to a center of the material wafer mounted on the susceptor, the temperature controller having a substantially rod shape or a substantially plate shape and extending in a direction substantially orthogonal to a non-mounting surface on a side of the non-mounting surface opposite to the mounting surface, an end of the temperature controller being substantially in point contact or line contact with a portion of the non-mounting surface, the portion of the non-mounting surface corresponding to the center of the material wafer, the temperature controller controlling the temperature of the portion of the susceptor corresponding to the center of the material wafer by absorbing heat of the portion of the non-mounting surface corresponding to the center of the material wafer.

* * * * *